(12) United States Patent
Yang et al.

(10) Patent No.: US 11,545,191 B2
(45) Date of Patent: Jan. 3, 2023

(54) CIRCUIT AND METHOD OF OPERATING THE SAME

(71) Applicants: TAIWAN SEMICONDUCTOR MANUFACTURING COMPANY, LTD., Hsinchu (TW); TSMC CHINA COMPANY, LIMITED, Songjiang (CN)

(72) Inventors: Xiu-Li Yang, Hsinchu (TW); Ching-Wei Wu, Hsinchu (TW); He-Zhou Wan, Hsinchu (TW); Ming-En Bu, Hsinchu (TW)

(73) Assignees: TAIWAN SEMICONDUCTOR MANUFACTURING COMPANY, LTD., Hsinchu (TW); TSMC CHINA COMPANY. LIMITED, Shanghai (CN)

( * ) Notice: Subject to any disclaimer, the term of this patent is extended or adjusted under 35 U.S.C. 154(b) by 0 days.

(21) Appl. No.: 17/166,797

(22) Filed: Feb. 3, 2021

(65) Prior Publication Data

US 2022/0199124 A1    Jun. 23, 2022

(30) Foreign Application Priority Data

Dec. 21, 2020   (CN) .......................... 202011517547.0

(51) Int. Cl.
*G11C 5/14*      (2006.01)
*H03K 19/20*     (2006.01)
(Continued)

(52) U.S. Cl.
CPC ............. *G11C 5/147* (2013.01); *H03K 3/012* (2013.01); *H03K 3/037* (2013.01); *H03K 19/017509* (2013.01); *H03K 19/20* (2013.01)

(58) Field of Classification Search
CPC .. H03K 17/16; H03K 17/161; H03K 19/0008; H03K 19/0013; H03K 19/0016;
(Continued)

(56) References Cited

U.S. PATENT DOCUMENTS 8,892,930 B2 * 11/2014 Yeh ...................... G06F 1/3287
326/62
9,443,564 B2 * 9/2016 Ishizu ................ G11C 14/0054
(Continued)

OTHER PUBLICATIONS

Office Action dated Jul. 15, 2022 for corresponding case No. TW 11120698280. (pp. 1-7).

*Primary Examiner* — Quan Tra
*Assistant Examiner* — Ahn-Quan Tra
(74) *Attorney, Agent, or Firm* — Hauptman Ham, LLP

(57) ABSTRACT

A circuit includes a power management circuit and a memory circuit. The power management circuit is configured to receive a first control signal and a second control signal, and to supply a first supply voltage, a second supply voltage and a third supply voltage. The first control signal has a first voltage swing, and the second control signal has a second voltage swing different from the first voltage swing. The first control signal causes the power management circuit to enter a power management mode having a first state and a second state. The memory circuit is coupled to the power management circuit, and is in the first state or the second state in response to at least the first supply voltage supplied by the power management circuit.

20 Claims, 19 Drawing Sheets

(51) Int. Cl.
*H03K 3/012* (2006.01)
*H03K 3/037* (2006.01)
*H03K 19/0175* (2006.01)

(58) Field of Classification Search
CPC . H03K 19/00315; G05F 3/242; G06F 1/3203; H02J 9/005
USPC .................................................. 327/544–546
See application file for complete search history.

(56) References Cited

U.S. PATENT DOCUMENTS

| | | | |
|---|---|---|---|
| 10,084,450 B1 | 9/2018 | Cox et al. | |
| 10,446,196 B1 * | 10/2019 | Narasimhan | G11C 5/147 |
| 10,607,660 B2 | 3/2020 | Kim et al. | |
| 2006/0007753 A1 | 1/2006 | Choi et al. | |
| 2006/0227593 A1 | 10/2006 | Choi | |
| 2009/0045844 A1 * | 2/2009 | Noh | H03K 19/018528 326/82 |
| 2020/0110549 A1 | 4/2020 | Kim | |

* cited by examiner

| Input | | | Power | | Output | | | Mode | |
|---|---|---|---|---|---|---|---|---|---|
| PISO (VDDM) | SDB (VDD) | SLPB (VDD) | VDD | VDDM | Periphery - VDDH / SLP_VDD | Periphery - VDDMH / SLP_VDDM | Cell Array - VDDAI / SD_VDDM | Mode | |
| 0 | 1 | 1 | ON | ON | ON/0 | ON/0 | ON/0 | Normal | Row 1 |
| 0 | 1 | 0 | ON | ON | OFF/1 | OFF/1 | ON/0 | Sleep | Row 2 |
| 0 | 0 | - | ON | ON | OFF/1 | OFF/1 | OFF/1 | Shut-Down | Row 3 |
| 1 | 1/Z* | - | ON/OFF | ON | OFF/1 | OFF/1 | ON/0 | Sleep | Row 4 |
| 1 | 0/Z* | - | ON/OFF | ON | OFF/1 | OFF/1 | OFF/1 | Shut-Down | Row 5 |

300

Rows 4-5: PMM

Power Management Mode (PMM)

1/Z*: SDB can change to HZ or unknown after "H" is latched
0/Z*: SDB can change to HZ or unknown after "L" is latched

FIG. 3

| Input | | Power | | Output | | | | |
|---|---|---|---|---|---|---|---|---|
| PISO | SLPB | VDD | VDDM | SLP_VDD | SLP_VDDM | SD_VDDM | Mode | |
| 0 | 1 | ON | ON | 0 | 0 | 0 | Normal | Row 1 |
| 0 | 0 | ON | ON | 1 | 1 | 0 | Sleep | Row 2 |
| 1 | 1/Z* | ON/OFF | ON | 1 | 1 | 0 | Sleep | Row 3 |
| 1 | 0/Z* | ON/OFF | ON | 1 | 1 | 1 | Shut-Down | Row 4 |

Power Management
Mode (PMM)

1/Z*: SDB can change to HZ or unknown after "H" is latched
0/Z*: SDB can change to HZ or unknown after "L" is latched

FIG. 9

CIRCUIT AND METHOD OF OPERATING THE SAME

BACKGROUND

The semiconductor integrated circuit (IC) industry has produced a wide variety of digital devices to address issues in a number of different areas. Some of these digital devices, such as level shifter circuits, are configured to enable operation of circuits capable of operation in different voltage domains. As ICs have become smaller and more complex, operating voltages of these digital devices continue to decrease affecting IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a truth table of the circuit in FIG. 1 or FIG. 2, in accordance with some embodiments.

FIG. 9 is a truth table of the circuit in FIG. 1 or FIG. 8, in accordance with some embodiments.

DETAILED DESCRIPTION

Figure 1:
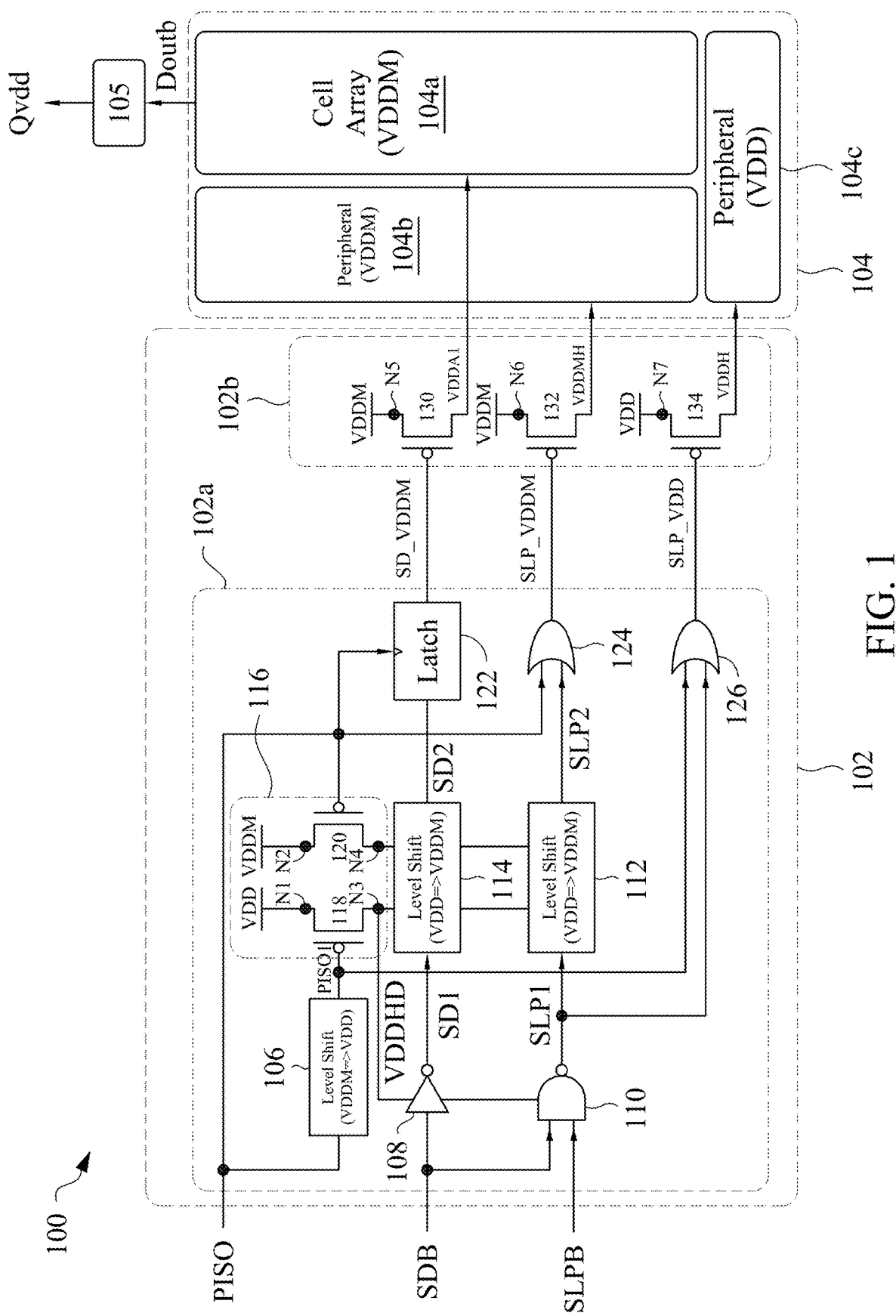
FIG. 1 is a block diagram of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a circuit includes a power control circuit coupled to a first voltage supply having a first voltage and a second voltage supply having a second voltage. In some embodiments, the power control circuit is configured to generate a first output control signal, a second output control signal and a third output control signal in response to at least a first control signal, a second control signal or a third control signal. In some embodiments, the first control signal causes the power control circuit to enter a power management mode having a first reduced power state and a second reduced power state.

In some embodiments, the circuit further includes a first header circuit coupled to the power control circuit, and configured to supply at least a first supply voltage, a second supply voltage or a third supply voltage in response to at least the first output control signal, the second output control signal or the third output control signal. In some embodiments, the power management mode includes the second voltage supply being disabled or turned off. In some embodiments, the power control circuit and the first header circuit are part of a power management circuit.

In some embodiments, the circuit further includes a memory circuit coupled to the power control circuit and the first header circuit. In some embodiments, the memory circuit is in the first reduced power state or the second reduced power state in response to at least the first supply voltage or the power control circuit entering the power management mode. In some embodiments, the first reduced power state corresponds to a sleep mode of the memory circuit, and the second reduced power state corresponds to a shut-down mode of the memory circuit.

In some embodiments, at least the first voltage or the first control signal have a first voltage swing, and at least the second voltage, the second control signal or the third control signal have a second voltage swing different from the first voltage swing allowing for the circuit to have a dual-rail design and/or implementation.

In some embodiments, the circuit can automatically enter the power management mode by the use of the first control signal thereby reducing power consumption and having a more flexible design than other approaches.

In some embodiments, the circuit can enter the power management mode even when the power management mode includes the second voltage supply being disabled or turned off, resulting in less power consumption and a more flexible design than other approaches.

Integrated Circuit

FIG. 1 is a block diagram of an integrated circuit 100, in accordance with some embodiments.

Integrated circuit 100 comprises a power management circuit 102, a memory circuit 104 and an output circuit 105.

Power management circuit 102 is configured to receive control signals PISO, SDB and SLPB, and to generate voltages VDDAI, VDDMH and VDDH.

In some embodiments, power management circuit 102 is coupled to a first voltage supply node N1 and a second voltage supply node N2. In some embodiments, first voltage supply node N1 has a first supply voltage VDD1, and is therefore referred to as being in a VDD voltage domain. In some embodiments, first supply voltage VDD1 has a first voltage swing. In some embodiments, one or more of control signals SDB or SLPB have the first voltage swing. In some embodiments, voltage VDDH has the first voltage swing.

In some embodiments, second voltage supply node N2 has a second supply voltage VDDM1, and is therefore referred to as being in a VDDM voltage domain. In some embodiments, second supply voltage VDDM1 has a second voltage swing different from the first voltage swing.

In some embodiments, control signal PISO has the second voltage swing. In some embodiments, at least voltage VDDAI or VDDMH has the second voltage swing.

Power management circuit 102 is configured to control the operational mode of memory circuit 104. For example, power management circuit 102 is configured to adjust at least voltage VDDAI, VDDMH or VDDH thereby causing memory circuit 104 to be in a normal mode, a sleep mode (retention state) or a shutdown mode (non-retention state). In some embodiments, a sleep mode (retention mode) corresponds to the memory circuit 104 operating with a lower amount of power than the normal mode, but the memory circuit 104 is able to retain the data stored in a memory cell array 104a (described below). In some embodiments, a shutdown mode (non-retention mode) corresponds to the memory circuit 104 being turned off and the data previously stored in the memory cell array 104a is not retained. Other operational modes are within the scope of the present disclosure.

Power management circuit 102 includes a control circuit 102a coupled with a header circuit 102b.

Control circuit 102a is configured to receive at least control signal PISO, SDB or SLPB, and to generate at least power management control signal SD_VDDM, SLP_VDDM or SLP_VDD. In some embodiments, control circuit 102a is configured to control the operational mode of memory circuit 104. Control circuit 102a is configured to control header circuit 102b by power management control signals SD_VDDM, SLP_VDDM and SLP_VDD. In some embodiments, control circuit 102a is configured to adjust at least voltage VDDAI, VDDMH or VDDH of header circuit 102b responsive to corresponding power management control signal SD_VDDM, SLP_VDDM or SLP_VDD, thereby causing memory circuit 104 to be in the normal mode, the sleep mode (retention state) or the shutdown mode (non-retention state).

In some embodiments, control signal SLP_VDD has the first voltage swing. In some embodiments, at least control signal SLP_VDDM or SD_VDDM has the second voltage swing.

Control circuit 102a includes a level shifter circuit 106, an inverter 108, a NAND logic gate 110, a level shifter circuit 112, a level shifter circuit 114, a header circuit 116, a latch 122, an OR logic gate 124 and an OR logic gate 126.

Level shifter circuit 106 is configured to receive at least control signal PISO. Level shifter circuit 106 is a level shifter circuit configured to shift control signal PISO from the VDDM voltage domain (that uses the second supply voltage VDDM1) to the VDD voltage domain (that uses the first supply voltage VDD1) thereby generating control signal PISO1. In some embodiments, control signal PISO1 is referred to as a first level shifted control signal. In some embodiments, control signal PISO1 has the first voltage swing.

Level shifter circuit 106 is coupled to header circuit 116 and OR logic gate 126. In some embodiments, level shifter circuit 106 is coupled to a gate of PMOS transistor 118, and is coupled to a first input terminal of OR logic gate 126. In some embodiments, level shifter circuit 106 is coupled to the first voltage supply node N1 and the second voltage supply node N2 (not shown).

Inverter 108 is coupled to level shifter circuit 114. Inverter 108 is further coupled to header circuit 116 by a voltage supply node N3. In some embodiments, inverter 108 is coupled to a drain of PMOS transistor 118 by the voltage supply node N3. Inverter 108 is configured to generate a control signal SD1 in response to control signal SDB. In some embodiments, control signal SD1 is inverted from control signal SDB. In some embodiments, control signal SD1 has the first voltage swing. An input terminal of inverter 108 is configured to receive control signal SDB. An output terminal of inverter 108 is coupled to an input of level shifter circuit 114. A voltage supply node (unlabeled) of inverter 108 is coupled to node N3. In some embodiments the voltage supply node of inverter 108 is configured to receive voltage VDDHD of node N3.

NAND logic gate 110 is coupled to at least level shifter circuit 116 or the OR logic gate 126. NAND logic gate 110 is further coupled to header circuit 116 by the voltage supply node N3. In some embodiments, NAND logic gate 110 is coupled to the drain of PMOS transistor 118 by the voltage supply node N3. NAND logic gate 110 is configured to generate a NAND control signal SLP1 in response to control signal SLPB. In some embodiments, NAND control signal SLP1 has the first voltage swing. The NAND logic gate 110 includes an output terminal configured to output the NAND control signal SLP1, and is coupled to an input of shifter circuit 112 and a second input terminal of the OR logic gate 126. The NAND logic gate 124 further includes a first input terminal configured to receive control signal SDB and a second input terminal configured to receive control signal SLPB.

Level shifter circuit 112 is configured to receive at least NAND control signal SLP1. Level shifter circuit 112 is a level shifter circuit configured to shift NAND control signal SLP1 from the VDD voltage domain (that uses the first supply voltage VDD1) to the VDDM voltage domain (that uses the second supply voltage VDDM1) thereby generating a NAND control signal SLP2. In some embodiments, NAND control signal SLP2 is referred to as a level shifted NAND control signal. In some embodiments, NAND control signal SLP2 has the second voltage swing.

Level shifter circuit 112 is coupled to NAND logic gate, header circuit 116 and OR logic gate 124. In some embodiments, level shifter circuit 112 is coupled to a drain of PMOS transistor 118 by node N3, and is coupled to a drain of PMOS transistor 120 by node N4. In some embodiments, an output of level shifter circuit 112 is coupled to a second input terminal of OR logic gate 124. In some embodiments, the output of level shifter circuit 112 is configured to output NAND control signal SLP2 to the second input terminal of OR logic gate 124. In some embodiments, level shifter circuit 112 is coupled to the first voltage supply node N1 and the second voltage supply node N2.

Level shifter circuit 114 is configured to receive at least control signal SD1. Level shifter circuit 114 is a level shifter circuit configured to shift control signal SD1 from the VDD voltage domain (that uses the first supply voltage VDD1) to the VDDM voltage domain (that uses the second supply voltage VDDM1) thereby generating a control signal SD2. In some embodiments, control signal SD2 is referred to as a second level shifted control signal. In some embodiments, control signal SD2 has the second voltage swing.

Level shifter circuit 114 is coupled to inverter 108, header circuit 116 and latch circuit 122. In some embodiments, level shifter circuit 114 is coupled to the drain of PMOS transistor 118 by node N3, and is coupled to the drain of PMOS transistor 120 by node N4. In some embodiments, an output of level shifter circuit 114 is coupled to a first input terminal of latch circuit 122. In some embodiments, the output of level shifter circuit 114 is configured to output control signal SD2 to the first input terminal of latch circuit 122. In some embodiments, level shifter circuit 114 is coupled to the first voltage supply node N1 and the second voltage supply node N2.

Header circuit 116 includes PMOS transistors 118 and 120. In some embodiments, header circuit 116 is enabled or disabled in response to control signal PISO. In some embodiments, header circuit 116 is configured to supply first supply voltage VDD1 to node N3 in response to being enabled by control signal PISO, and to supply second supply voltage VDDM1 to node N4 in response to being enabled by control signal PISO1. In some embodiments, if the voltage of node N3 is equal to the first supply voltage VDD1, and if the voltage of node N4 is equal to the second supply voltage VDDM1, then at least inverter 108, NAND logic gate 110, level shifter circuit 112 or level shifter circuit 114 are enabled.

In some embodiments, if header circuit 116 is disabled by control signal PISO or PISO1, then node N3 and node N4 are floating or in a high-impedance state. In some embodiments, if node N3 and N4 are floating or in the high impedance state, then at least inverter 108, NAND logic gate 110, level shifter circuit 112 or level shifter circuit 114 are disabled.

A source terminal of PMOS transistor 118 is configured as the first voltage supply node N1. First voltage supply node N1 is configured to receive the first supply voltage VDD1 from the first voltage supply. A gate terminal of PMOS transistor 118 is configured to receive control signal PISO1 from level shifter circuit 106. A drain terminal of PMOS transistor 118 is coupled to level shifter circuit 112, level shifter circuit 114, inverter 108 and NAND logic gate 110 by node N3. In some embodiments, PMOS transistor 118 is configured to set the voltage VDDHD of node N3 in response to control signal PISO1.

In some embodiments, PMOS transistor 118 is configured to supply first supply voltage VDD1 to node N3 in response to being enabled by control signal PISO1. In some embodiments, if PMOS transistor 118 is disabled by control signal PISO1, then node N3 is floating or in the high-impedance state.

A source terminal of PMOS transistor 120 is configured as the second voltage supply node N2. Second voltage supply node N2 is configured to receive the second supply voltage VDDM1 from the second voltage supply. A gate terminal of PMOS transistor 120 is configured to receive control signal PISO. A drain terminal of PMOS transistor 120 is coupled to level shifter circuit 112 and level shifter circuit 114 by node N4.

In some embodiments, PMOS transistor 120 is configured to set the voltage VDDMHD of node N4 in response to control signal PISO1.

In some embodiments, PMOS transistor 120 is configured to supply the second supply voltage VDDM1 to node N4 in response to being enabled by control signal PISO. In some embodiments, if PMOS transistor 120 is disabled by control signal PISO, then node N4 is floating or in the high-impedance state.

Other transistor types or numbers of transistors are in the scope of the present disclosure for header circuit 116. For example, in some embodiments, header circuit 116 includes at least one N-type Metal Oxide Semiconductor (NMOS) transistor.

Latch circuit 122 is configured to receive control signal SD2 and control signal PISO. Latch circuit 122 is configured to generate control signal SD_VDDM. In some embodiments, latch circuit 122 is configured to latch a state of control signal SD2 in response to control signal PISO. In some embodiments, latch circuit 122 is configured to latch a previous state of control signal SD2 in response to control signal PISO. In some embodiments, control signal SD_VDDM is a latched state of control signal SD2 in response to a rising edge of control signal PISO. In some embodiments, control signal SD_VDDM is a latched state of control signal SD2 in response to a falling edge of control signal PISO.

A first input terminal of latch circuit 122 is coupled to the output of level shifter circuit 114, and is configured to receive control signal SD2. A second input terminal of latch circuit 122 is configured to receive control signal PISO. In some embodiments, the second input terminal of latch circuit 122 is a clock input terminal of the latch circuit 122. An output terminal of latch circuit 122 is coupled to a gate of PMOS transistor 130 of header circuit 102b, and is configured to output control signal SD_VDDM.

In some embodiments, latch circuit 122 corresponds to a positive or a negative level triggered device. In some embodiments, latch circuit 122 corresponds to a positive or a negative level triggered flip-flop. In some embodiments, latch circuit 122 corresponds to an SR-flip-flop. In some embodiments, latch circuit 122 includes a DQ flip-flop, a T flip-flop, a JK flip-flop, or the like.

OR logic gate 124 is coupled to at least level shifter circuit 112 or a gate of PMOS transistor 132 of header circuit 102b. OR logic gate 124 is configured to generate control signal SLP_VDDM in response to control signals PISO and SLP2. OR logic gate 124 includes a first input terminal configured to receive control signal PISO and a second input terminal configured to receive control signal SLP2. The second input terminal of OR logic gate 124 is coupled to the output of level shifter circuit 112. OR logic gate 124 further includes an output terminal coupled to the gate of PMOS transistor 132 of header circuit 102b. The output terminal of OR logic gate 124 is configured to output the control signal SLP_VDDM to the gate of PMOS transistor 132 of header circuit 102b.

OR logic gate 126 is coupled to at least level shifter circuit 106, an output of NAND logic gate 110, or a gate of PMOS transistor 134 of header circuit 102b. OR logic gate 126 is configured to generate control signal SLP_VDD in response to control signals PISO1 and SLP1. OR logic gate 126 includes a first input terminal configured to receive control signal PISO1 from level shifter circuit 106, and a second input terminal configured to receive control signal SLP1 from NAND logic gate 110. The first input terminal of OR logic gate 126 is coupled to the output of level shifter circuit 106. The second input terminal of OR logic gate 126 is coupled to the output of NAND logic gate 110. OR logic gate 126 further includes an output terminal coupled to the gate of PMOS transistor 134 of header circuit 102b. The output terminal of OR logic gate 126 is configured to output the control signal SLP_VDD to the gate of PMOS transistor 134 of header circuit 102b.

Header circuit 102b includes P-type Metal Oxide Semiconductor (PMOS) transistors 130, 132 and 134.

In some embodiments, header circuit 102b is enabled or disabled in response to at least control signal SD_VDDM, SLP_VDDM or SLP_VDD. In some embodiments, header circuit 102b is configured to supply voltages VDDAI, VDDMH and VDDH to corresponding memory cell array 104a, peripheral circuit 104b and peripheral circuit 104c in response to corresponding control signals SD_VDDM, SLP_VDDM and SLP_VDD. In some embodiments, voltage VDDH is in the VDD voltage domain. In some embodiments, at least voltage VDDAI or voltage VDDMH is in the VDDM voltage domain.

In some embodiments, if header circuit 102b is enabled by control signal SD_VDDM, then header circuit 102b is configured to supply second supply voltage VDDM1 as voltage VDDAI to memory cell array 104a, and memory cell array 104a is in an ON state. In some embodiments, if header circuit 102b is disabled by control signal SD_VDDM, then memory cell array 104a is in an OFF state.

In some embodiments, if header circuit 102b is enabled by control signal SLP_VDDM, then header circuit 102b is configured to supply second supply voltage VDDM1 as voltage VDDMH to peripheral circuit 104b, and peripheral circuit 104b is in an ON state. In some embodiments, if header circuit 102b is disabled by control signal SLP_VDDM, then peripheral circuit 104b is in an OFF state.

In some embodiments, if header circuit 102b is enabled by control signal SLP_VDD, then header circuit 102b is configured to supply first supply voltage VDD1 as voltage VDDH to peripheral circuit 104c, and peripheral circuit 104c is in an ON state. In some embodiments, if header circuit 102b is disabled by control signal SLP_VDD, then peripheral circuit 104c is in an OFF state.

Other transistor types or numbers of transistors are in the scope of the present disclosure for header circuit 102b. For example, in some embodiments, header circuit 102b includes at least one NMOS transistor.

A source terminal of PMOS transistor 130 is configured as voltage supply node N5. Voltage supply node N5 is configured to receive the second supply voltage VDDM1 from the second voltage supply. A gate terminal of PMOS transistor 130 is configured to receive control signal SD_VDDM from latch circuit 122. A drain terminal of PMOS transistor 130 is coupled to memory cell array 104a. In some embodiments, PMOS transistor 130 is configured to set the voltage VDDAI in response to control signal SD_VDDM.

A source terminal of PMOS transistor 132 is configured as voltage supply node N6. Voltage supply node N6 is configured to receive the second supply voltage VDDM1 from the second voltage supply. A gate terminal of PMOS transistor 132 is configured to receive control signal SLP_VDDM from OR logic gate 124. A drain terminal of PMOS transistor 132 is coupled to peripheral circuit 104b. In some embodiments, PMOS transistor 132 is configured to set the voltage VDDMH in response to control signal SLP_VDDM.

A source terminal of PMOS transistor 134 is configured as voltage supply node N7. Voltage supply node N7 is configured to receive the first supply voltage VDD1 from the first voltage supply. A gate terminal of PMOS transistor 134 is configured to receive control signal SLP_VDD from OR logic gate 126. A drain terminal of PMOS transistor 134 is coupled to peripheral circuit 104c. In some embodiments, PMOS transistor 134 is configured to set the voltage VDDH in response to control signal SLP_VDD.

Other transistor types or numbers of transistors are in the scope of the present disclosure for header circuit 102b. For example, in some embodiments, header circuit 102b includes at least one NMOS transistor.

Memory circuit 104 is coupled to power management circuit 102 and output circuit 105. Memory circuit 104 is configured to receive supply voltages VDDAI, VDDMH and VDDH from header circuit 102b. In some embodiments, memory circuit 104 is configured to store data Doutb. In some embodiments, memory circuit 104 is configured to output the stored data Doutb to output circuit 105.

Memory circuit 104 includes a memory cell array 104a, a peripheral circuit 104b and a peripheral circuit 104c. In the embodiment of FIG. 1, memory circuit 104 is a static random access memory (SRAM) circuit. SRAM is used for illustration, and other types of memories are within the scope of various embodiments. In some embodiments, memory circuit 104 is a dynamic random access memory (DRAM) circuit, other forms of volatile RAM memory, or the like. In some embodiments, memory circuit 104 is a resistive random access memory (RRAM) circuit, a ferroelectric RAM (F-RAM), a Magnetoresistive RAM (MRAM), Phase-change memory (PCM), other forms of non-volatile RAM memory, or the like.

Memory cell array 104a and peripheral circuit 104b are each configured to operate in the VDDM voltage domain. Peripheral circuit 104c is configured to operate in the VDD voltage domain.

Memory cell array 104a is configured to store data Doutb. At least one of memory cells in memory cell array 104a is configured to store a logic "1" or a logic "0". At least one of the memory cells in memory cell array 104a are coupled to the supply voltage node N5 by PMOS transistor 130. At least one of the memory cells in memory cell array 104a are configured to receive voltage VDDAI. In some embodiments, voltage VDDAI corresponds to second supply voltage VDDM1.

In some embodiments, memory cell array 104a includes one or more 4 transistor (4T) SRAM cells, 5 transistor (5T) SRAM cells, 6 transistor (6T) SRAM cells, 8 transistor (8T) SRAM cells, or the like. In some embodiments, memory cell array 104a includes one or more single port (SP) SRAM cells. In some embodiments, memory cell array 104a includes one or more dual port (DP) SRAM cells. Different types of memory cells in memory cell array 104a are within the contemplated scope of the present disclosure. In some embodiments, memory cell array 104a is a DRAM cell array, other forms of volatile RAM memory cell arrays, or the like. In some embodiments, memory cell array 104a is an RRAM memory cell array, an F-RAM memory cell array, an MRAM memory cell array, a PCM memory cell array, other forms of non-volatile RAM memory cell arrays, or the like.

Peripheral circuit 104b is coupled to and configured to control memory cell array 104a. Peripheral circuit 104b is configured to operate in the VDDM voltage domain. At least one of the circuits in peripheral circuit 104b is coupled to the supply voltage node N6 by PMOS transistor 132. At least one of the circuits in peripheral circuit 104b is configured to receive voltage VDDMH. In some embodiments, voltage VDDMH corresponds to second supply voltage VDDM1.

In some embodiments, peripheral circuit 104b includes one or more of row decoders, column decoders, read bit line pre-charge logic, sense amplifiers, timing and control circuits, or the like configured to operate in the VDDM voltage domain. Different types of circuits in peripheral circuit 104b are within the contemplated scope of the present disclosure.

Peripheral circuit 104c is coupled to and configured to control memory cell array 104a. Peripheral circuit 104c is configured to operate in the VDD voltage domain. At least one of the circuits in peripheral circuit 104c is coupled to the supply voltage node N7 by PMOS transistor 134. At least one of the circuits in peripheral circuit 104c is configured to receive voltage VDDH. In some embodiments, voltage VDDH corresponds to first supply voltage VDD1.

In some embodiments, peripheral circuit 104c includes one or more of row decoders, column decoders, read bit line pre-charge logic, sense amplifiers, timing and control circuits, or the like configured to operate in the VDD voltage domain. Different types of circuits in peripheral circuit 104c are within the contemplated scope of the present disclosure.

Output circuit 105 is coupled to memory cell array 104a. Output circuit 105 is configured to receive the stored data Doutb from memory cell array 104a, and is configured to generate a clamped output data signal Qvdd. In some embodiments, the clamped output data signal Qvdd corresponds to the store datad Doutb. In some embodiments, output circuit 105 includes a buffer circuit 502 (FIG. 5) configured to buffer the store data Doutb. In some embodiments, the stored data Doutb is in the VDDM voltage domain, and the clamped output data signal Qvdd is in the VDD voltage domain.

Figure 2:
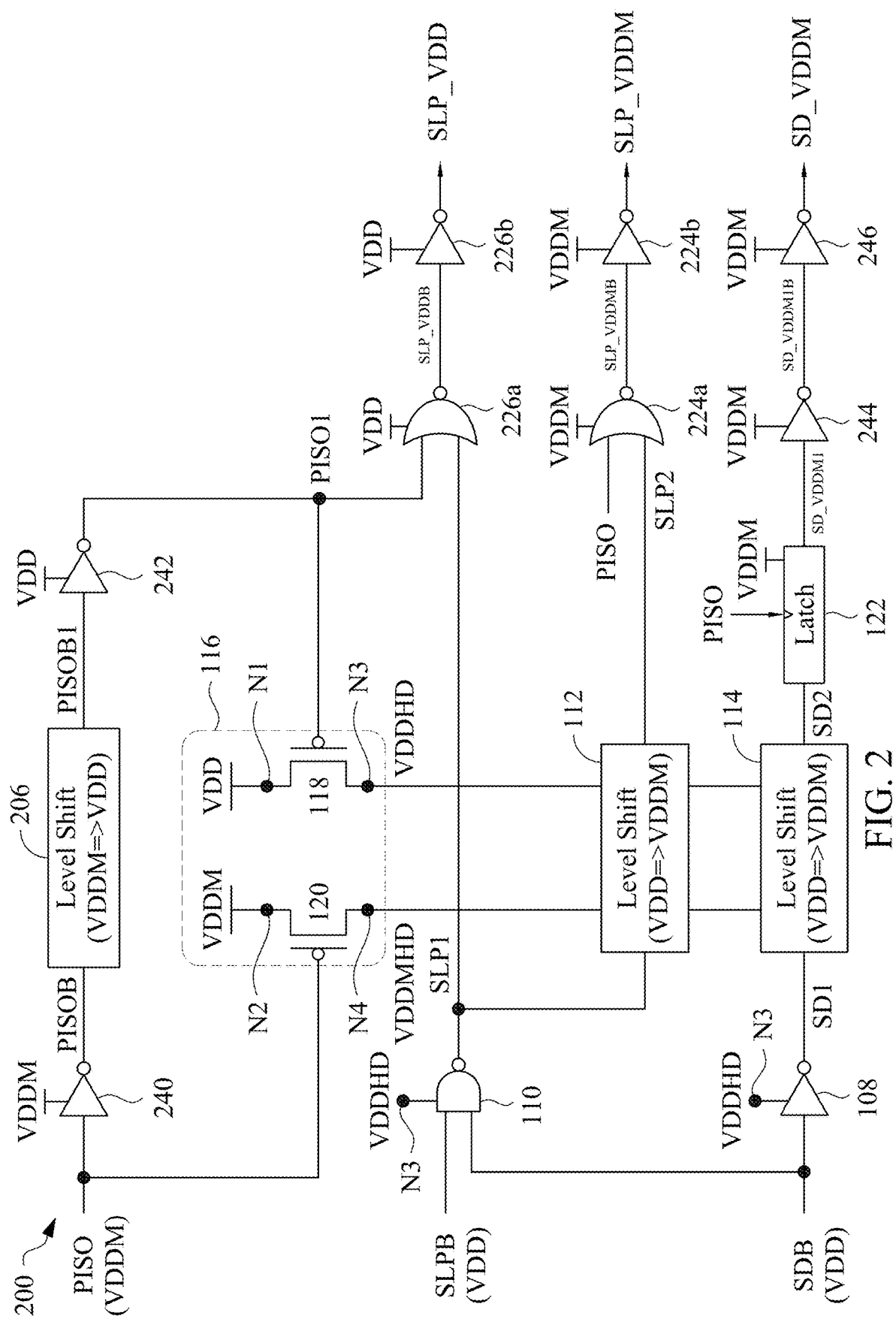
FIG. 2 is a circuit diagram of a circuit, in accordance with some embodiments.

FIG. 2 is a circuit diagram of a circuit 200, in accordance with some embodiments.

Circuit 200 is an embodiment of control circuit 102a of FIG. 1.

Components that are the same or similar to those in one or more of FIGS. 2, 5-6, 8, 11 and 12 (shown below) are given the same reference numbers, and detailed description thereof is thus omitted.

Circuit 200 includes a level shifter circuit 206, inverter 108, NAND logic gate 110, level shifter circuit 112, level shifter circuit 114, header circuit 116, latch 122, a NOR logic gate 224a, an inverter 224b, a NOR logic gate 226a, an inverter 226b, an inverter 240, an inverter 242, an inverter 244 and an inverter 246.

In comparison with control circuit 102a of FIG. 1, level shifter circuit 206 replaces level shifter circuit 106, NOR logic gate 224a and inverter 224b of circuit 200 replace OR logic gate 124, and NOR logic gate 226a and inverter 226b of circuit 200 replace OR logic gate 126, and similar detailed description is therefore omitted.

In comparison with control circuit 102a of FIG. 1, circuit 200 further includes inverter 240, inverter 242, inverter 244 and inverter 246.

NOR logic gate 224a is coupled to at least level shifter circuit 112. NOR logic gate 224a is configured to generate control signal SLP_VDDMB in response to control signals PISO and SLP2. In some embodiments, control signal SLP_VDDMB has the second voltage swing. NOR logic gate 224a includes a first input terminal configured to receive control signal PISO and a second input terminal configured to receive control signal SLP2. The second input terminal of NOR logic gate 224a is coupled to the output of level shifter circuit 112. NOR logic gate 224a further includes an output terminal coupled to an input terminal of inverter 224b. The output terminal of NOR logic gate 224a is configured to output the control signal SLP_VDDMB to the input terminal of inverter 224b. A voltage supply node (unlabeled) of NOR logic gate 224a is configured to receive second supply voltage VDDM1.

Inverter 224b is coupled to NOR logic gate 224a. Inverter 224b is configured to generate control signal SLP_VDDM in response to control signal SLP_VDDMB. In some embodiments, control signal SLP_VDDM is inverted from control signal SLP_VDDMB. An input terminal of inverter 224b is coupled to the output terminal of NOR logic gate 224a, and configured to receive control signal SLP_VDDMB. An output terminal of inverter 224b is configured to output control signal SLP_VDDM. A voltage supply node (unlabeled) of inverter 224b is configured to receive second supply voltage VDDM1. In some embodiments, NOR logic gate 224a and inverter 224b have the same function of OR logic gate 124 of FIG. 1.

NOR logic gate 226a is coupled to at least inverter 242, an output of NAND logic gate 110, or an input terminal of inverter 226b. NOR logic gate 226a is configured to generate control signal SLP_VDDB in response to control signals PISO1 and SLP1. In some embodiments, control signal SLP_VDDB has the first voltage swing. NOR logic gate 226a includes a first input terminal configured to receive control signal PISO1 from inverter 242, and a second input terminal configured to receive control signal SLP1 from NAND logic gate 110. The first input terminal of NOR logic gate 226a is coupled to the output terminal of inverter 242. The second input terminal of NOR logic gate 226a is coupled to the output of NAND logic gate 110. NOR logic gate 226a further includes an output terminal coupled to the input terminal of inverter 226b. The output terminal of NOR logic gate 226a is configured to output the control signal SLP_VDDB to the input terminal of inverter 226b. A voltage supply node (unlabeled) of NOR logic gate 226a is configured to receive first supply voltage VDD1.

Inverter 226b is coupled to NOR logic gate 226a. Inverter 226b is configured to generate control signal SLP_VDD in response to control signal SLP_VDDB. In some embodiments, control signal SLP_VDD is inverted from control signal SLP_VDDB. An input terminal of inverter 226b is coupled to the output terminal of NOR logic gate 226a, and configured to receive control signal SLP_VDDB. An output terminal of inverter 226b is configured to output control signal SLP_VDD. A voltage supply node (unlabeled) of inverter 226b is configured to receive first supply voltage VDD1. In some embodiments, NOR logic gate 226a and inverter 226b have the same function of OR logic gate 126 of FIG. 1.

Inverter 240 is coupled to the input of level shifter circuit 206. Inverter 240 is configured to generate a control signal PISOB in response to control signal PISO. In some embodiments, control signal PISOB is inverted from control signal PISO. In some embodiments, control signal PISOB has the second voltage swing. An input terminal of inverter 240 is configured to receive control signal PISO. An output terminal of inverter 240 is coupled to an input of level shifter circuit 206, and configured to output control signal PISOB. A voltage supply node (unlabeled) of inverter 240 is configured to receive second supply voltage VDDM1.

Level shifter circuit 206 is a variation of level shifter circuit 106 of FIG. 1, and similar detailed description is omitted. In comparison with level shifter circuit 106 of FIG. 1, an input of level shifter circuit 206 is coupled to an output terminal of inverter 240 and configured to receive signal PISOB, and an output of level shifter circuit 206 is coupled to an input terminal of inverter 242, and configured to output signal PISOB1.

Level shifter circuit 206 is configured to shift control signal PISOB from the VDDM voltage domain (that uses second supply voltage VDDM1) to the VDD voltage domain (that uses first supply voltage VDD1) thereby generating control signal PISOB1. In some embodiments, control signal PISOB1 has the first voltage swing, and control signal PISOB has the second voltage swing.

Inverter 242 is coupled to the output of level shifter circuit 206. Inverter 242 is configured to generate control signal PISO1 in response to control signal PISOB1. In some embodiments, control signal PISO1 is inverted from control signal PISOB1. In some embodiments, control signal PISOB1 has the first voltage swing. An input terminal of inverter 242 is coupled to an output of level shifter circuit 206, and configured to receive control signal PISOB1. An output terminal of inverter 242 is configured to output control signal PISO1. An output terminal of inverter 242 is coupled to the gate of PMOS transistor 118 and a first input terminal of NOR logic gate 226a. A voltage supply node (unlabeled) of inverter 242 is configured to receive second supply voltage VDDM1.

Inverter 244 is coupled between latch circuit 122 and inverter 246. Inverter 244 is configured to generate inverted control signal SD_VDDM1B in response to control signal SD_VDDM1. In some embodiments, control signal SD_VDDM1B is inverted from control signal SD_VDDM1. In some embodiments, at least control signal SD_VDDM1B or SD_VDDM1 has the second voltage swing. An input terminal of inverter 244 is coupled to an output of latch circuit 122, and configured to receive control signal SD_VDDM1. An output terminal of inverter 244 is configured to output control signal SD_VDDM1B. An output terminal of inverter 244 is coupled to an input terminal of inverter 246. A voltage supply node (unlabeled) of inverter 244 is configured to receive second supply voltage VDDM1.

Inverter 246 is coupled to inverter 244. Inverter 246 is configured to generate control signal SD_VDDM in response to control signal SD_VDDM1B. In some embodiments, control signal SD_VDDM is inverted from control signal SD_VDDM1B. In some embodiments, control signal SD_VDDM is a delayed version of control signal SD_VDDM1. An input terminal of inverter 246 is coupled to the output terminal of inverter 244, and configured to receive control signal SD_VDDM1B. An output terminal of inverter 246 is configured to output control signal SD_VDDM. A voltage supply node (unlabeled) of inverter 246 is configured to receive second supply voltage VDDM1.

Truth Table

FIG. 3 is a truth table 300 of the circuit 100 in FIG. 1 or circuit 200 in FIG. 2, in accordance with some embodiments. The values and format of table 300 are provided as an example, and other values and/or formats for Table 300 are within the scope of the present disclosure.

As shown in row 1 of truth table 300 of FIG. 3, if control signal PISO is a logical 0, control signal SDB is a logical 1 and control signal SLPB is a logical 1, then power management circuit 102 or circuit 200 cause control signals SLP_VDD, SLP_VDDM and SD_VDDM to each be a logical 0 thereby causing memory circuit 104 to be in a normal mode.

As shown in row 2 of truth table 300 of FIG. 3, if control signal PISO is a logical 0, control signal SDB is a logical 1 and control signal SLPB is a logical 0, then power management circuit 102 or circuit 200 cause control signals SLP_VDD and SLP_VDDM to each be a logical 1, and control signal SD_VDDM to be a logical 0 thereby causing memory circuit 104 to be in a sleep mode (retention mode).

As shown in row 3 of truth table 300 of FIG. 3, if control signal PISO is a logical 0 and control signal SDB is a logical 0, then power management circuit 102 or circuit 200 cause each of control signals SLP_VDD, SLP_VDDM and SD_VDDM to be a logical 1 thereby causing memory circuit 104 to be in a shut-down mode (non-retention mode). In some embodiments, for at least row 3 of truth table 300, the value of control signal SLPB is a don't care condition and is shown as a "–" in FIG. 3.

As shown in rows 4 and 5 of truth table 300 of FIG. 3, when control signal PISO is a logical 1 causes memory circuit 104 to automatically be in either the sleep mode (retention mode) or the shutdown mode (non-retention mode) thereby reducing the power consumption of at least circuit 100 or 200.

As shown in row 4 of truth table 300 of FIG. 3, if control signal PISO is a logical 1 and control signal SDB is a logical 1, then power management circuit 102 or circuit 200 cause control signals SLP_VDD and SLP_VDDM to each be a logical 1, and control signal SD_VDDM to be a logical 0 thereby causing memory circuit 104 to be in the sleep mode (retention mode). In some embodiments, for at least row 4 of truth table 300, the value of control signal SLPB is a don't care condition. In some embodiments, for at least row 4 of truth table 300, control signal SDB is in a floating or high impedance state (Z*) after signal SD2 is latched by latch circuit 122 and the first supply voltage VDD1 is turned off by a control circuit 1200 (FIG. 12) thereby causing at least level shifter circuit 114 or 116 in FIGS. 1-2 to be disabled.

As shown in row 5 of truth table 300 of FIG. 3, if control signal PISO is a logical 1, and control signal SDB is a logical 0, then power management circuit 102 or circuit 200 cause each of control signals SLP_VDD, SLP_VDDM and SD_VDDM to be a logical 1 thereby causing memory circuit 104 to be in the shut-down mode (non-retention mode). In some embodiments, for at least row 5 of truth table 300, the value of control signal SLPB is a don't care condition. In some embodiments, for at least row 5 of truth table 300, control signal SDB is in a floating or high impedance state (Z*) after signal SD2 is latched by latch circuit 122 and the first supply voltage VDD1 is turned off by a control circuit 1200 (FIG. 12) thereby causing at least level shifter circuit 114 or 116 in FIGS. 1-2 to be disabled.

Waveforms

FIGS. 4A-4E are graphs of waveforms 400A-400E of a circuit, in accordance with some embodiments. In some embodiments, waveforms 400A-400E correspond to the waveforms of circuit 100 of FIG. 1 or circuit 200 of FIG. 2.

Waveform 400A includes curves 410, 412, 414 and 416 of signals in circuit 100 or 200 for the shut-down mode (non-retention). Waveform 400B includes curves 410, 412, 414' and 416 of signals in circuit 100 or 200 for the shut-down mode (non-retention). Waveform 400C includes curves 420, 422, 424 and 426 of signals in circuit 100 or 200 for the shut-down mode (non-retention). Waveform 400D includes curves 430, 432, 434, 436 of signals in circuit 100 or 200 for the sleep mode (retention). Waveform 400E includes curves 440, 442, 444 and 446 of signals in circuit 100 or 200 for the sleep mode (retention).

In some embodiments, at least curve 410, 420, 430 or 440 represents first supply voltage VDD1 of FIGS. 1 & 2; at least curve 412, 422, 432 or 442 represents control signal PISO of FIGS. 1-2; at least curve 414, 414', 424, 434 or 444 represents control signal SDB of FIGS. 1-2; and at least curve 416, 426, 436, 446 represents control signal SLPB of FIGS. 1-2.

Waveform 400A includes curves 410, 412, 414 and 416 of signals in circuit 100 or 200 for the shut-down mode (non-retention). In some embodiments, waveform 400A shows a transition from the normal mode (e.g., row 1 in Table 300) to the shut-down mode (e.g., row 5 in Table 300).

At time T1, curve 410 is a logical 1, curve 412 is a logical 0, curve 414 is a logical 1, curve 416 is a logical 1, and memory circuit 104 is in the normal mode (e.g., row 1 in Table 300 of FIG. 3). At time T1, curve 414 begins transitioning from a logical 1 to a logical 0. For example, in some embodiments, curves 410, 412, 414 and 416 at time T1 corresponds to row 1 of the entries shown in Table 300.

At time T2, curve 414 finishes transitioning to a logical 0 which causes control signal SLP_VDD and SLP_VDDM to transition from a logical 0 to a logical 1 thereby causing circuit 100 or 200 to enter the shut-down mode (e.g., row 3 of Table 300).

At time T3, curve 412 begins transitioning from a logical 0 to a logical 1, thereby causing power management circuit 100 to enter the power management mode which causes memory circuit 104 to enter the shut-down mode.

At time T4, curve 412 is half-way between a logical 0 and a logical 1. The change in curve 412 from logical 0 to logical 1, causes the latch circuit 122 to latch the previous state of curve 414 (e.g., control signal SDB) which is a logical 0. In some embodiments, the previous state of curve 414 (e.g., control signal SDB) is the value of curve 414 at time T2. However, latch circuit 122 satisfies both a setup time Ts and a hold time Th for proper latching of stable, state information.

Figure 4A:
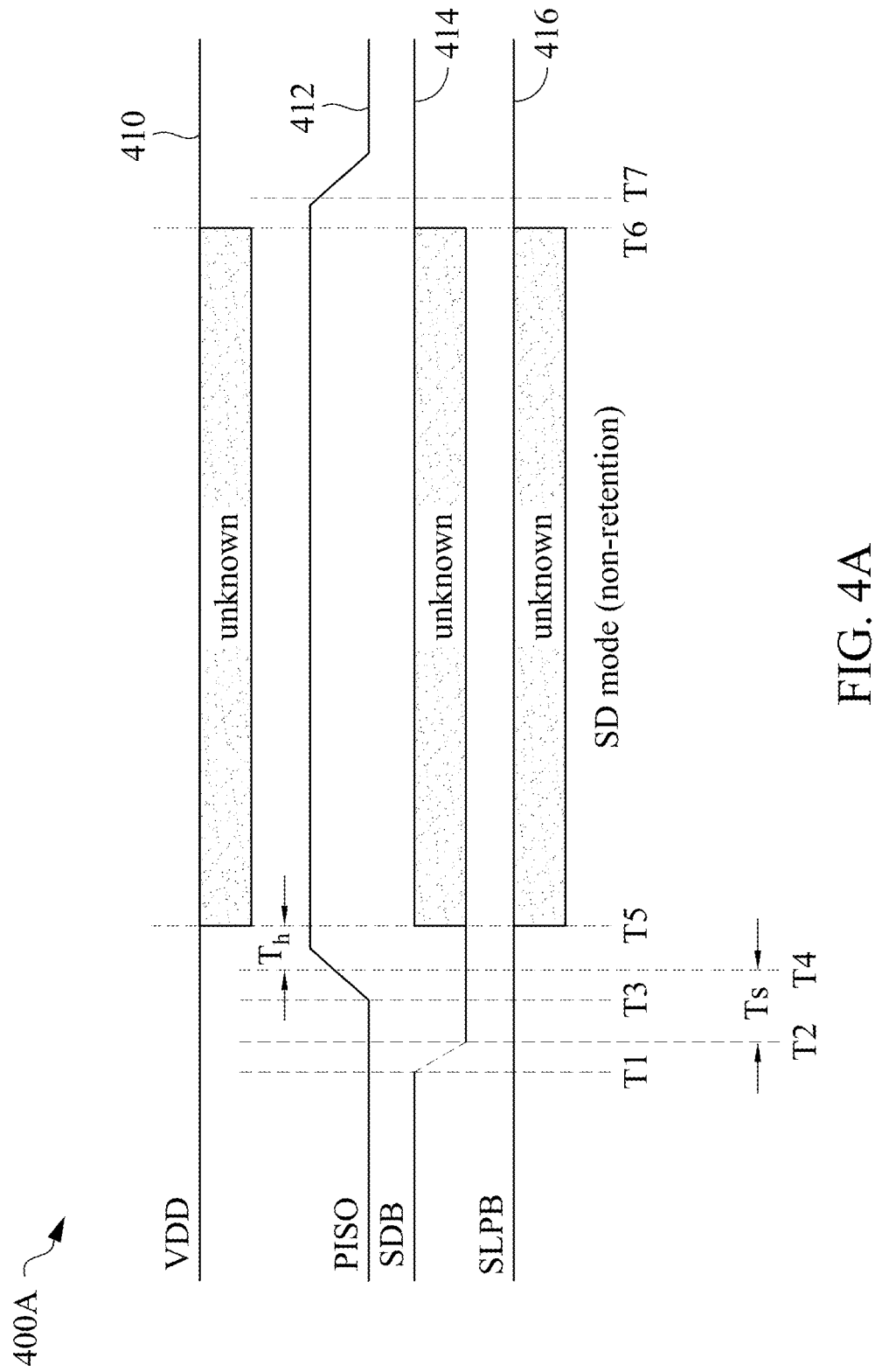
FIGS. 4A-4E are graphs of waveforms of a circuit, in accordance with some embodiments.

A difference between time T4 and T2 is the setup time Ts of latch circuit 122. In some embodiments, the setup time Ts corresponds to the minimum time interval for which the input signal (e.g., control signal SD2) of latch circuit 122 is stable (e.g., unchanging) prior to the sampling event of the clock signal (e.g., control signal PISO) for the input signal (e.g., control signal SD2) to be correctly recognized by latch circuit 122. For example, in some embodiments, if curve 414 changes within the setup time Ts of latch circuit 122, then latch circuit 122 may not latch the proper state of curve 414. As shown in FIG. 4A, since the transition of curve 414 from a logical 1 to a logical 0 occurs at time T2 which is before the setup time Ts, the previous state of curve 414 (e.g., control signal SDB) is a logical 0, and is properly latched by latch circuit 122. However, if the control signal SD (shown in FIG. 4B as curve 414') changes state between time T2 and T4, then the latch circuit 122 may latch the state prior to the transition.

At time T5, curve 412 is a logical 1 which causes power management circuit 100 to be in the power management mode thereby causing memory circuit 104 to be in the shut-down (non-retention) mode (e.g., row 5 of Table 300).

A difference between time T4 and T5 is the hold time Th of latch circuit 122. In some embodiments, hold time Th is the minimum time interval for which the input signal (e.g., control signal SD2) of latch circuit 122 is stable (e.g., unchanging) following the sampling event of the clock signal (e.g., control signal PISO) for the (e.g., control signal SD2) to be correctly recognized by latch circuit 122. For example, in some embodiments, if curve 414 changes within the hold time Th of latch circuit 122, then latch circuit 122 may not latch the proper state of curve 414.

Between time T5-T6, memory circuit 104 is in the shut-down mode (non-retention) (e.g., row 5 of Table 300).

At time T7, curve 412 begins transitioning from a logical 1 to a logical 0, thereby causing power management circuit 100 to leave the power management mode.

After time T7, curve 412 is a logical 0, and power management circuit 100 leaves the power management mode, and returns to the normal mode.

Figure 4B:
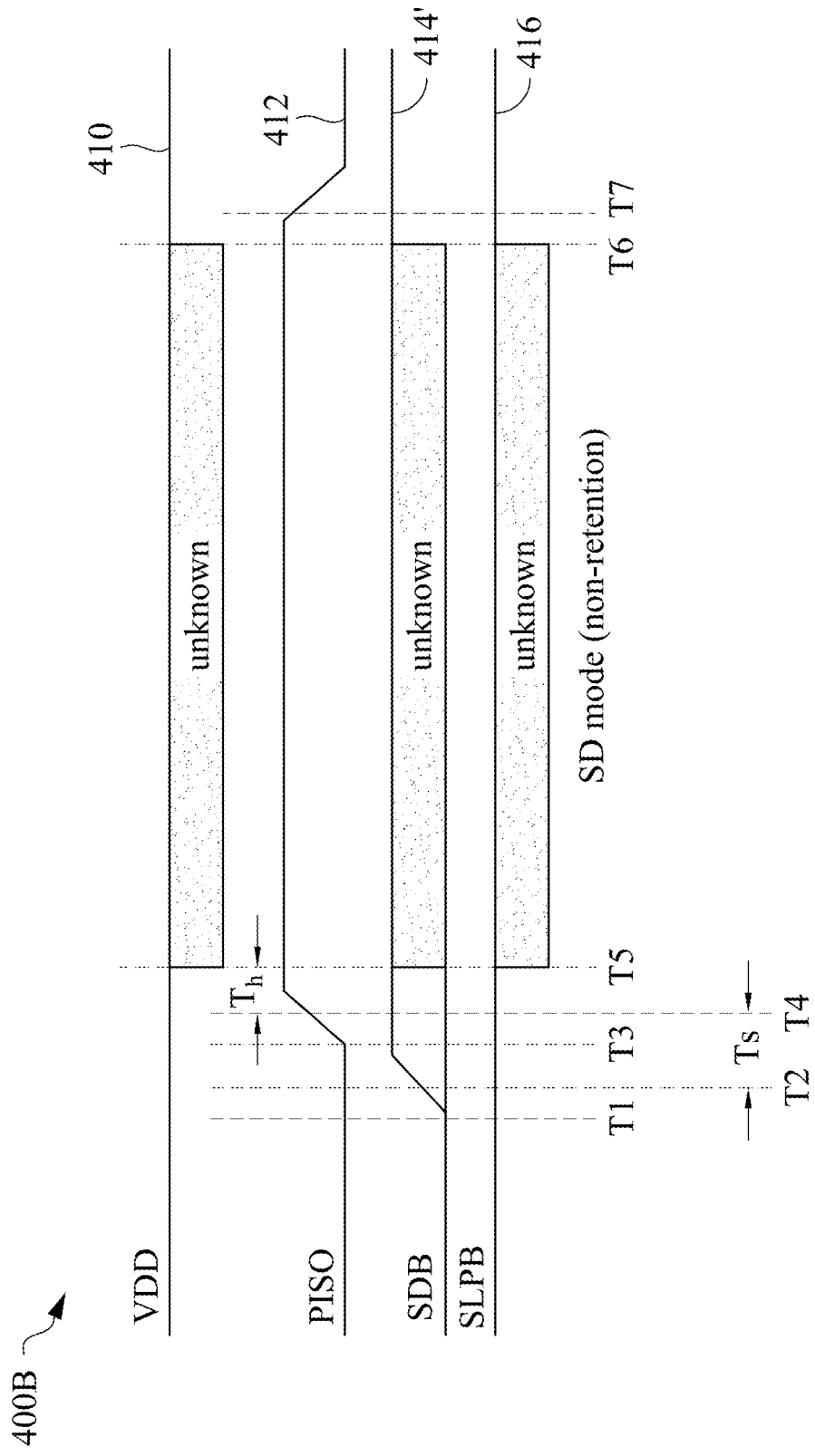

FIG. 4B is a graph of waveform 400B of a circuit, in accordance with some embodiments.

Waveform 400B includes curves 410, 412, 414' and 416 of signals in circuit 100 or 200 for the shut-down mode (non-retention). Waveform 400B is a variation of waveform 400A, and similar detailed description is therefore omitted. In comparison with waveform 400A, curve 414' of FIG. 4B replaces curve 414, and similar detailed description is therefore omitted.

Waveform 400B shows when curve 414' (e.g., control signal SDB) changes states between time T2 and T4 (within the setup time Ts), and therefore latch circuit 122 latches the state of curve 414' prior to the transition at time T2 (e.g., logical 0).

In some embodiments, curve 414' of waveform 400B shows a transition from the shut-down mode (e.g., row 3 in Table 300) to the shut-down mode (e.g., row 5 in Table 300).

At time T1, curve 414' begins transitioning from a logical 0 to a logical 1.

After time T2 and before time T3, curve 414' finishes transitioning to a logical 1.

At time T3, curve 412 begins transitioning from a logical 0 to a logical 1, thereby causing power management circuit 100 to enter the power management mode which causes memory circuit 104 to enter the shut-down mode.

At time T4, curve 412 is half-way between a logical 0 and a logical 1. The change in curve 412 from logical 0 to logical 1, causes the latch circuit 122 to latch the previous state of curve 414' (e.g., control signal SDB) which is a logical 0. Since curve 414' (e.g., control signal SDB) changes states between time T2 and T4 (within the setup time Ts), latch circuit 122 therefore latches the state of curve 414' prior to the transition at time T2 (e.g., logical 0) in order to satisfy the setup time Ts for proper latching of a stable state.

At time T5, curve 412 is a logical 1 which causes power management circuit 100 to be in the power management mode thereby causing memory circuit 104 to be in the shut-down (non-retention) mode (e.g., row 5 of Table 300).

After time T5 for FIG. 4B is similar to FIG. 4A, and similar detailed description is therefore omitted for brevity.

Figure 4C:
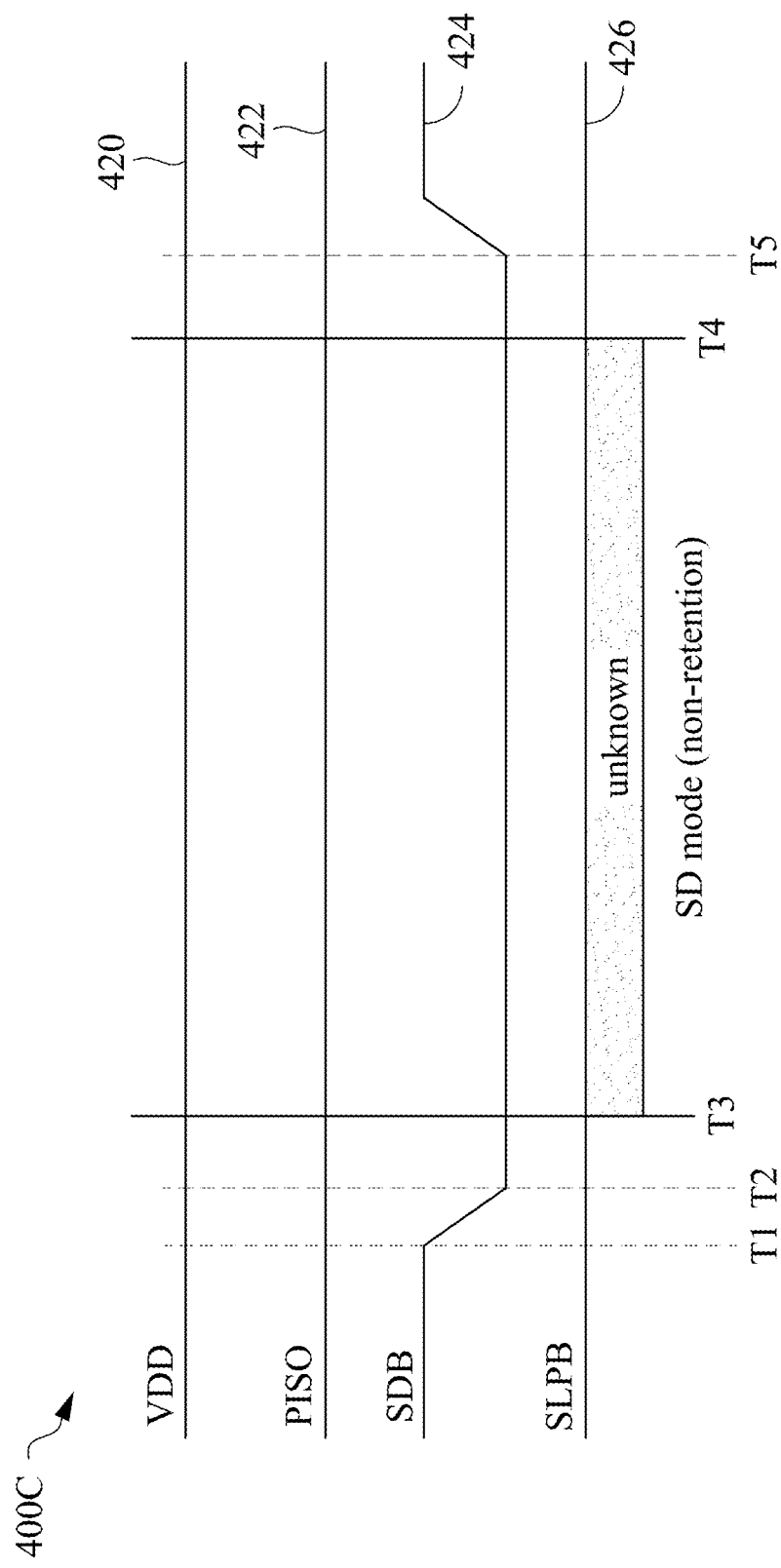

FIG. 4C is a graph of waveform 400C of a circuit, in accordance with some embodiments. Waveform 400C is an example of power management circuit 100 being in the power management mode, and memory circuit 104 being in the shut-down mode (non-retention state). Waveform 400C includes curves 420, 422, 424 and 426 of signals in circuit 100 or 200 for the shut-down mode (non-retention). In some embodiments, waveform 400C shows a transition from the sleep mode (e.g., row 2 in Table 300) to the shut-down mode (e.g., row 3 in Table 300).

At time T1, curve 422 is a logical 0 and power management circuit 100 is not in power management mode. At time T1, curve 424 transitions from a logical 1 to a logical 0 which causes control signal SD_VDDM to transition from a logical 0 (e.g., row 2 in Table 300) to a logical 1 (e.g., row 3 in Table 300) thereby causing memory circuit 104 to enter the shutdown mode (non-retention). For example, in some embodiments, this transition of curve 424 corresponds to a transition from row 3 to row 4 of the entries shown in Table 300 for latch circuit 122 being a positive level-sensitive latch.

At time T2, curve 424 is a logical 0, which causes control signal SD_VDDM to transition from a logical 0 to a logical 1 thereby causing circuit 100 or 200 to enter the shut-down mode (e.g., row 3 of Table 300).

Between time T3-T4, memory circuit 104 is in the shut-down mode (non-retention).

At time T5, curve 422 is a logical 0 and curve 424 transitions from a logical 0 to a logical 1 which causes control signal SD_VDDM to transition from a logical 1 to a logical 0 thereby causing memory circuit 104 to enter the sleep mode (retention). For example, in some embodiments, this transition of curve 424 corresponds to a transition from row 3 to row 2 of the entries shown in Table 300.

After time T5, curve 424 is a logical 1.

Figure 4D:
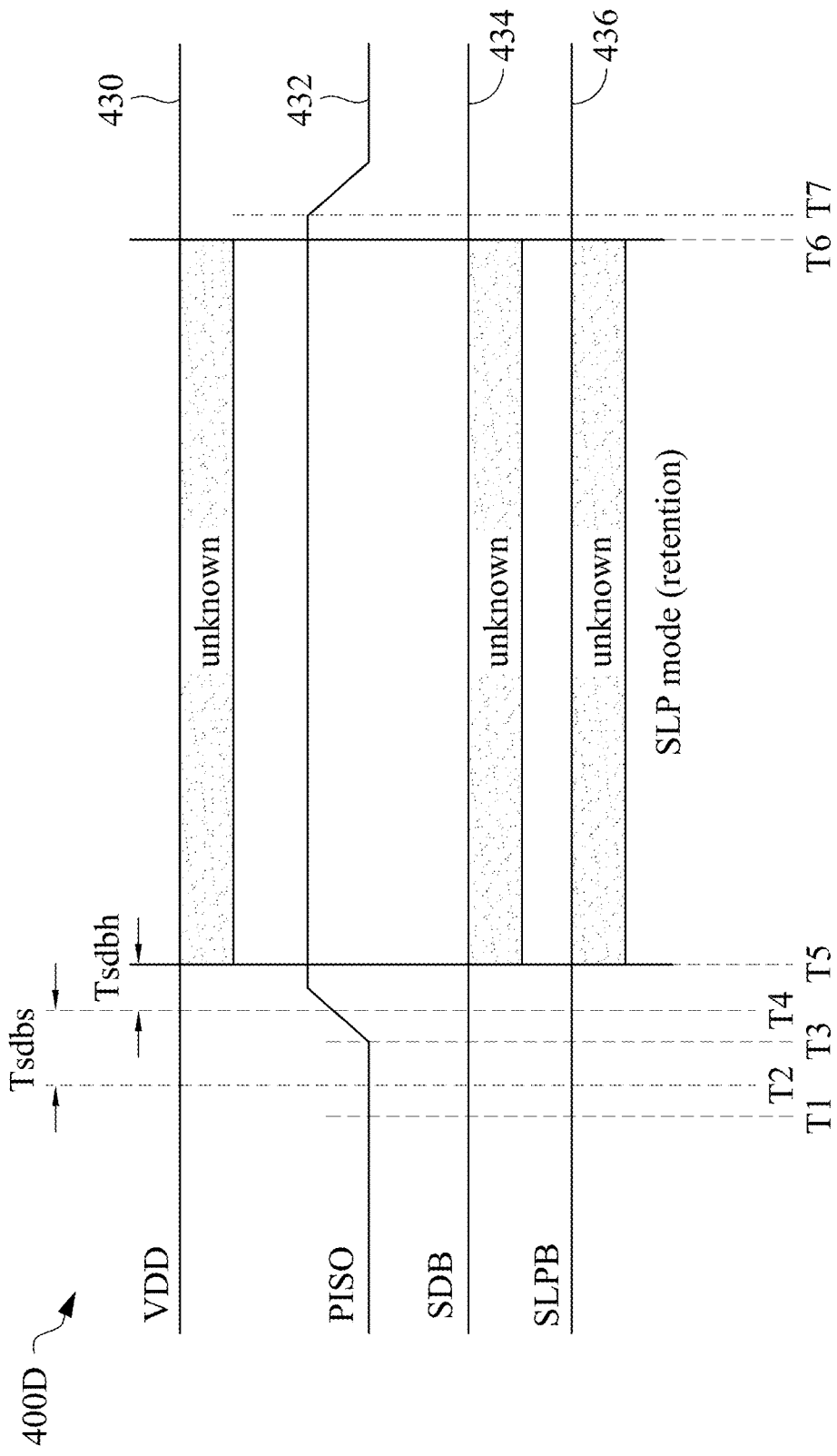

FIG. 4D is a graph of waveform 400D of a circuit, in accordance with some embodiments. Waveform 400D is an example of power management circuit 100 entering the power management mode, and memory circuit 104 entering the sleep mode (retention state). Waveform 400D includes curves 430, 432, 434, 436 of signals in circuit 100 or 200 for the shut-down mode (non-retention). In some embodiments, waveform 400D shows a transition from the normal mode (e.g., row 1 in Table 300) to the sleep mode (e.g., row 4 in Table 300).

The timing labels of waveform 400D is similar to the timing labels of waveform 400A, and similar detailed description is therefore omitted for brevity.

At times T1-T2 and, curve 430 is a logical 1, curve 432 is a logical 0, curve 434 is a logical 1, curve 436 is a logical 1, and memory circuit 104 is in the normal mode (e.g., row 1 in Table 300 of FIG. 3).

At time T3, curve 432 begins transitioning from a logical 0 to a logical 1, thereby causing power management circuit 100 to enter the power management mode which causes control signals SLP_VDD and SLP_VDDM to transition from a logical 0 to a logical 1 thereby causing memory circuit 104 to enter the sleep mode.

At time T4, curve 432 is half-way between a logical 0 and a logical 1. The change in curve 432 from logical 0 to logical 1, causes the latch circuit 122 to latch the previous state of curve 434 (e.g., control signal SDB) which is a logical 1.

At time T5, curve 432 is a logical 1 which causes power management circuit 100 to be in the power management mode thereby causing memory circuit 104 to be in the sleep (retention) mode (e.g., row 4 of Table 300).

Between time T5-T6, memory circuit 104 is in the sleep mode (retention) (e.g., row 4 of Table 300).

At time T7, curve 432 begins transitioning from a logical 1 to a logical 0, thereby causing power management circuit 100 to leave the power management mode.

After time T7, curve 432 is a logical 0, and power management circuit 100 leaves the power management mode, and returns to the normal mode (e.g., row 1 of Table 300).

Figure 4E:
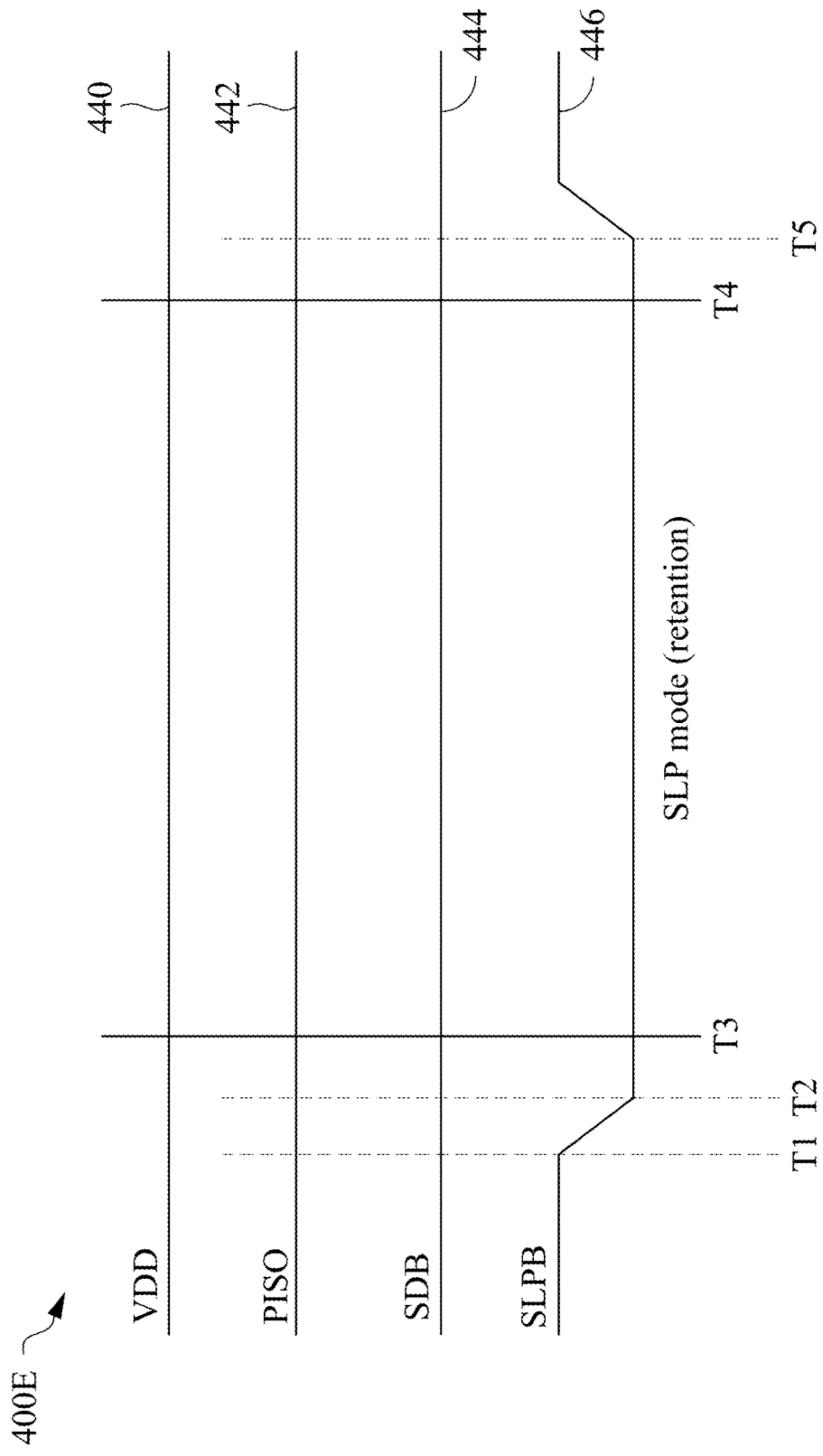

FIG. 4E is a graph of waveform 400E of a circuit, in accordance with some embodiments. Waveform 400E is an example of power management circuit 100 being in the power management mode, and memory circuit 104 being in the sleep mode (retention state). Waveform 400E includes curves 440, 442, 444 and 446 of signals in circuit 100 or 200 for the sleep mode (retention). For example, in some embodiments, FIG. 4E shows an example where memory circuit 104 is in the sleep mode (retention state) or row 4 of Table 300 despite the transition of curve 446.

At time T1, curve 442 is a logical 1 and power management circuit 100 is in power management mode. At time T1, curve 444 is a logical 1, and therefore memory circuit 104 is in sleep mode (retention). At time T1, curve 446 transitions from a logical 1 to a logical 0. For example, in some embodiments, time T1 of curves 442, 444 and 446 corresponds to row 4 of the entries shown in Table 300.

At time T2, curve 446 is a logical 0, but since curves 442 and 444 are a logical 1, the transition of curve 446 to a logical 0 does not affect the output of NOR gates 224a and 226a, and thus control signals SLP_VDD and SLP_VDDM are a logical 1, and control signal SD_VDDM is a logical 1.

Between time T3-T4, memory circuit 104 is in the sleep mode (retention).

At time T5, curves 442 and 444 are a logical 1, and curve 446 transitions from a logical 0 to a logical 1.

After time T5, curve 446 is a logical 1.

Output Circuit

Figure 5:
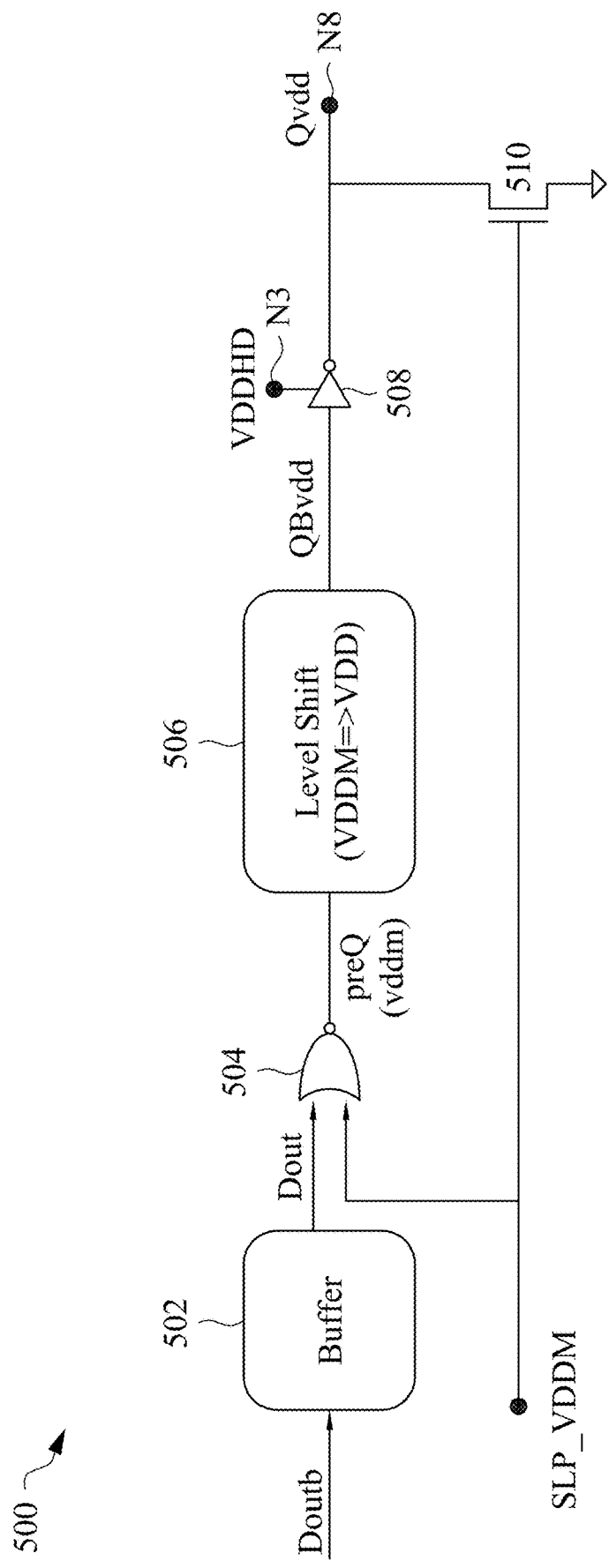
FIG. 5 is a circuit diagram of an output circuit, in accordance with some embodiments.

FIG. 5 is a circuit diagram of an output circuit 500, in accordance with some embodiments.

Output circuit 500 is an embodiment of output circuit 105 of FIG. 1.

Output circuit 500 is configured to clamp a signal Qvdd (in the VDD domain) by the use of control signal SLP_VDDM (in the VDDM domain). In some embodiments, the supply voltage VDD is turned off, thus a signal in the VDD domain cannot be used to clamp signal Qvdd, and a signal in the VDDM domain is used to clamp signal Qvdd. Other configurations exist such that other signals in the VDDM domain are capable of clamping signal Qvdd.

Output circuit 500 includes a buffer circuit 502, a NOR logic gate 504, a level shifter circuit 506, an inverter 508 and an NMOS transistor 510.

Buffer circuit 502 is coupled to NOR logic gate 504. Buffer circuit 502 is configured to receive data signal Doutb. Buffer circuit 502 is configured to output data signal Dout. Buffer circuit 502 is configured to buffer data signal Doutb thereby generating data signal Dout. In some embodiments, data signal Dout is a buffered version of data signal Doutb. In some embodiments, buffer circuit 502 is a complementary MOS (CMOS) buffer circuit.

NOR logic gate 504 is coupled to at least buffer circuit 502 or an input of level shifter circuit 506. NOR logic gate 504 is configured to generate signal preQ in response to data signal Dout and control signal SLP_VDDM. In some embodiments, control signal preQ has the second voltage swing. NOR logic gate 504 includes a first input terminal configured to receive data signal Dout from buffer circuit 502, and a second input terminal configured to receive the control signal SLP_VDDM from control circuit 102a in FIG. 1.

The first input terminal of NOR logic gate 504 is coupled to the output terminal of buffer circuit 502. The second input terminal of NOR logic gate 504 is coupled to control circuit 102a in FIG. 1. In some embodiments, the second input terminal of NOR logic gate 504 is coupled to inverter 224b in FIGS. 2, 6 and 8. In some embodiments, the second input terminal of NOR logic gate 504 is coupled to the output of OR logic gate 124 in FIG. 1.

NOR logic gate 504 further includes an output terminal coupled to the input of level shifter circuit 506. The output terminal of NOR logic gate 504 is configured to output the signal preQ to the input of level shifter circuit 506. A voltage supply node (unlabeled) of NOR logic gate 504 is configured to receive second supply voltage VDDM1.

Level shifter circuit 506 is configured to receive signal preQ. Level shifter circuit 506 is a level shifter circuit configured to shift signal preQ from the VDDM voltage domain (that uses the second supply voltage VDDM1) to the VDD voltage domain (that uses the first supply voltage VDD1) thereby generating control signal QBvdd. In some embodiments, signal QBvdd is referred to as a level shifted data signal. In some embodiments, signal QBvdd has the first voltage swing.

Level shifter circuit 506 is coupled to NOR logic gate 504 and inverter 508. In some embodiments, level shifter circuit 506 is further coupled to header circuit 116 (not shown). In some embodiments, level shifter circuit 506 is coupled to the first voltage supply node N1 and the second voltage supply node N2 (not shown). The input of level shifter circuit 506 is coupled to the output terminal of NOR logic gate 504. The output of level shifter circuit 506 is coupled to an input terminal of inverter 508, and configured to output signal PISOB1.

Inverter 508 is coupled to level shifter circuit 506 and NMOS transistor 510. Inverter 508 is configured to generate signal Qvdd in response to signal QBvdd. In some embodiments, signal Qvdd has the first voltage swing. In some embodiments, signal Qvdd is inverted from signal QBvdd. An input terminal of inverter 508 is coupled to the output of level shifter circuit 506, and configured to receive signal QBvdd. An output terminal of inverter 508 is configured to output signal Qvdd. A voltage supply node (unlabeled) of inverter 508 is coupled to node N3, and configured to receive first supply voltage VDD1.

A drain terminal of NMOS transistor 510 is coupled to the output terminal of inverter 508. A gate terminal of NMOS transistor 510 is coupled to control circuit 102a in FIG. 1. In some embodiments, the gate terminal of NMOS transistor 510 is coupled to inverter 224b in FIGS. 2, 6 and 8. In some embodiments, the gate terminal of NMOS transistor 510 is coupled to the output of OR logic gate 124 in FIG. 1. The gate terminal of NMOS transistor 510 is configured to receive control signal SLP_VDDM. A source terminal of NMOS transistor 510 is configured as a reference supply node configured to receive a reference supply voltage VSS from a reference supply.

In some embodiments, NMOS transistor 510 is configured to set or clamp signal Qvdd in response to control signal SLP_VDDM. For example, in some embodiments, if signal SLP_VDDM is a logical 1, then transistor 510 is turned on and pulls node N8 to ground causing signal Qvdd to be a logical 0. In other words, signal SLP_VDDM is used to clamp signal Qvdd to a logical 0.

In some embodiments, if signal SLP_VDDM is a logical 0, then NMOS transistor 510 is turned off, and signal Qvdd on node N8 is dependent upon data signal Dout. For example, in these embodiments, if signal SLP_VDDM is a logical 0 and data signal Dout is a logical 1, then signal Qvdd is a logical 1. For example, in these embodiments, if signal SLP_VDDM is a logical 0 and data signal Dout is a logical 0, then signal Qvdd is a logical 0. Thus, when signal SLP_VDDM is a logical 0, the value of signal Qvdd is equal to data signal Dout since memory cell array 104a is in a normal operational mode (state) configured to store or read data.

In some embodiments, when power management circuit 100 enters the power management mode by control signal PISO transitioning to a logical 1, supply voltage VDD is turned off by circuit 1200 (FIG. 12), and output circuit 500 is configured to clamp signal Qvdd (in the VDD domain) to a logical 0 by the use of control signal SLP_VDDM (in the VDDM domain). In these embodiments, since the supply voltage VDD is turned off, a signal in the VDD domain cannot be used to clamp signal Qvdd, and a signal in the VDDM domain is used to clamp signal Qvdd.

Circuit

Figure 6:
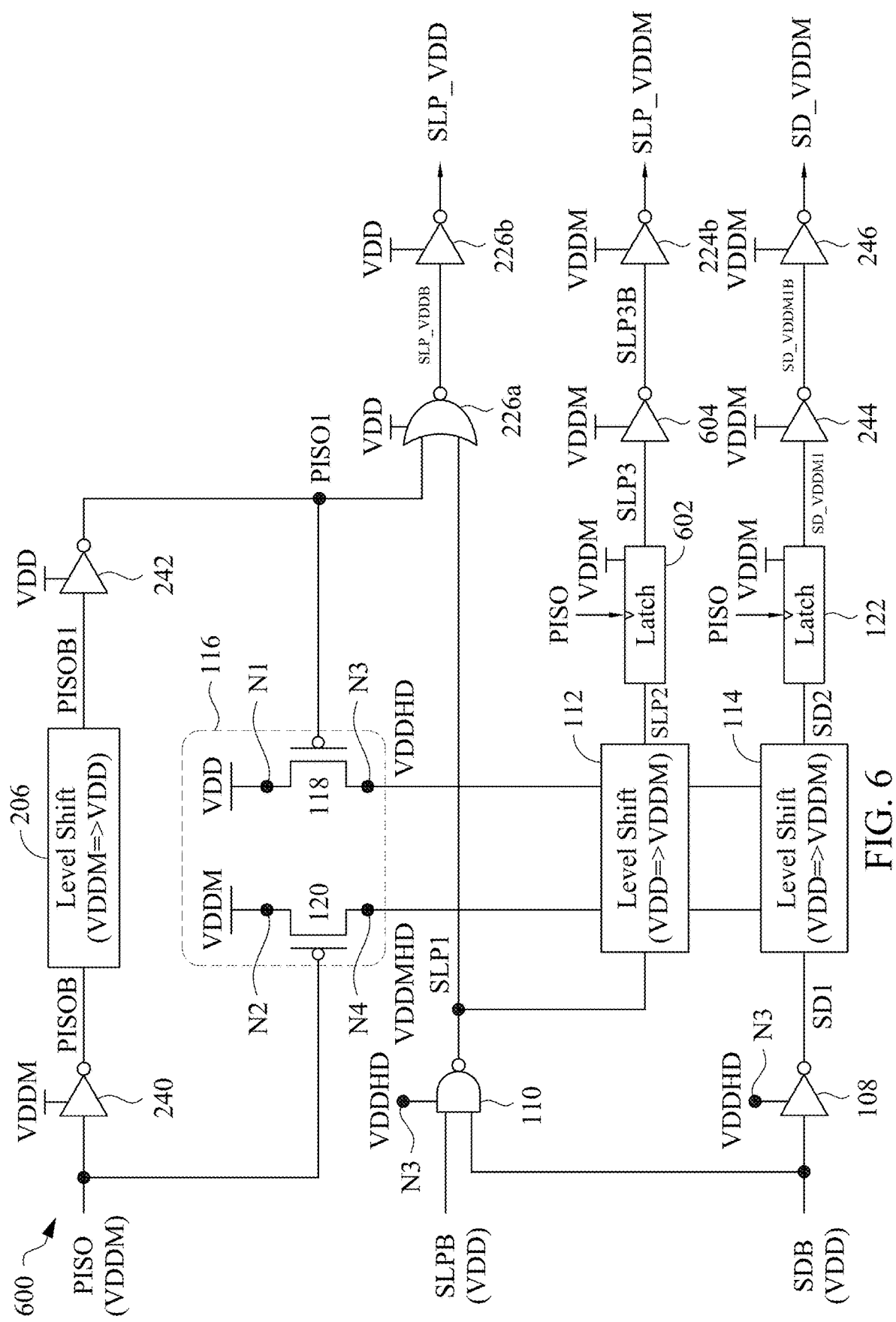
FIG. 6 is a circuit diagram of a circuit, in accordance with some embodiments.

FIG. 6 is a circuit diagram of a circuit 600, in accordance with some embodiments.

Circuit 600 is a variation of circuit 200 of FIG. 2, and similar detailed description is therefore omitted. In comparison with circuit 200 of FIG. 2, a latch circuit 602 of FIG. 6 and an inverter 604 of FIG. 6 replace NOR logic gate 224a, and similar detailed description is therefore omitted. Circuit 600 is an embodiment of control circuit 102a of FIG. 1.

Latch circuit 602 is configured to receive control signal PISO and control signal SLP2 from level shifter circuit 112. Latch circuit 602 is configured to generate a control signal SLP3. In some embodiments, control signal SLP3 has the second voltage swing. In some embodiments, latch circuit 602 is configured to latch a state of control signal SLP2 in response to control signal PISO. In some embodiments, latch circuit 602 is configured to latch a previous state of control signal SLP2 in response to control signal PISO. In some embodiments, control signal SLP3 or SLP_VDDM is a latched state of control signal SLP2 in response to a rising edge of control signal PISO. In some embodiments, control signal SLP3 or SLP_VDDM is a latched state of control signal SLP2 in response to a falling edge of control signal PISO.

A first input terminal of latch circuit 602 is coupled to the output of level shifter circuit 112, and is configured to receive control signal SLP2. A second input terminal of latch circuit 602 is configured to receive control signal PISO. In some embodiments, the second input terminal of latch circuit 602 is a clock input terminal of the latch circuit 602. An output terminal of latch circuit 602 is coupled to an input terminal of inverter 604, and is configured to output control signal SLP3.

In some embodiments, latch circuit 602 corresponds to a positive or a negative edge triggered flip-flop. In some embodiments, latch circuit 602 corresponds to an SR-flip-flop. In some embodiments, the edge triggered flip-flop includes an DQ flip-flop, a T flip-flop, a JK flip-flop, or the like. A voltage supply node (unlabeled) of latch circuit 602 is configured to receive second supply voltage VDDM1.

Inverter 604 is coupled between latch circuit 602 and inverter 224b. Inverter 604 is configured to generate control signal SLP3B in response to control signal SLP3. In some embodiments, control signal SLP3B has the second voltage swing. In some embodiments, control signal SLP3B is inverted from control signal SLP3. An input terminal of inverter 604 is coupled to the output terminal of latch circuit 602, and configured to receive control signal SLP3. An output terminal of inverter 604 is coupled to the input terminal of inverter 224b, and configured to output control signal SLP3B to the input terminal of inverter 224b. A voltage supply node (unlabeled) of inverter 604 is configured to receive second supply voltage VDDM1.

Inverter 224b of FIG. 6 is configured to generate control signal SLP_VDDM in response to control signal SLP3B. In some embodiments, control signal SLP_VDDM is inverted from control signal SLP3B. In some embodiments, control signal SLP_VDDM is a delayed version of control signal SLP3.

Waveforms

Figure 7A:
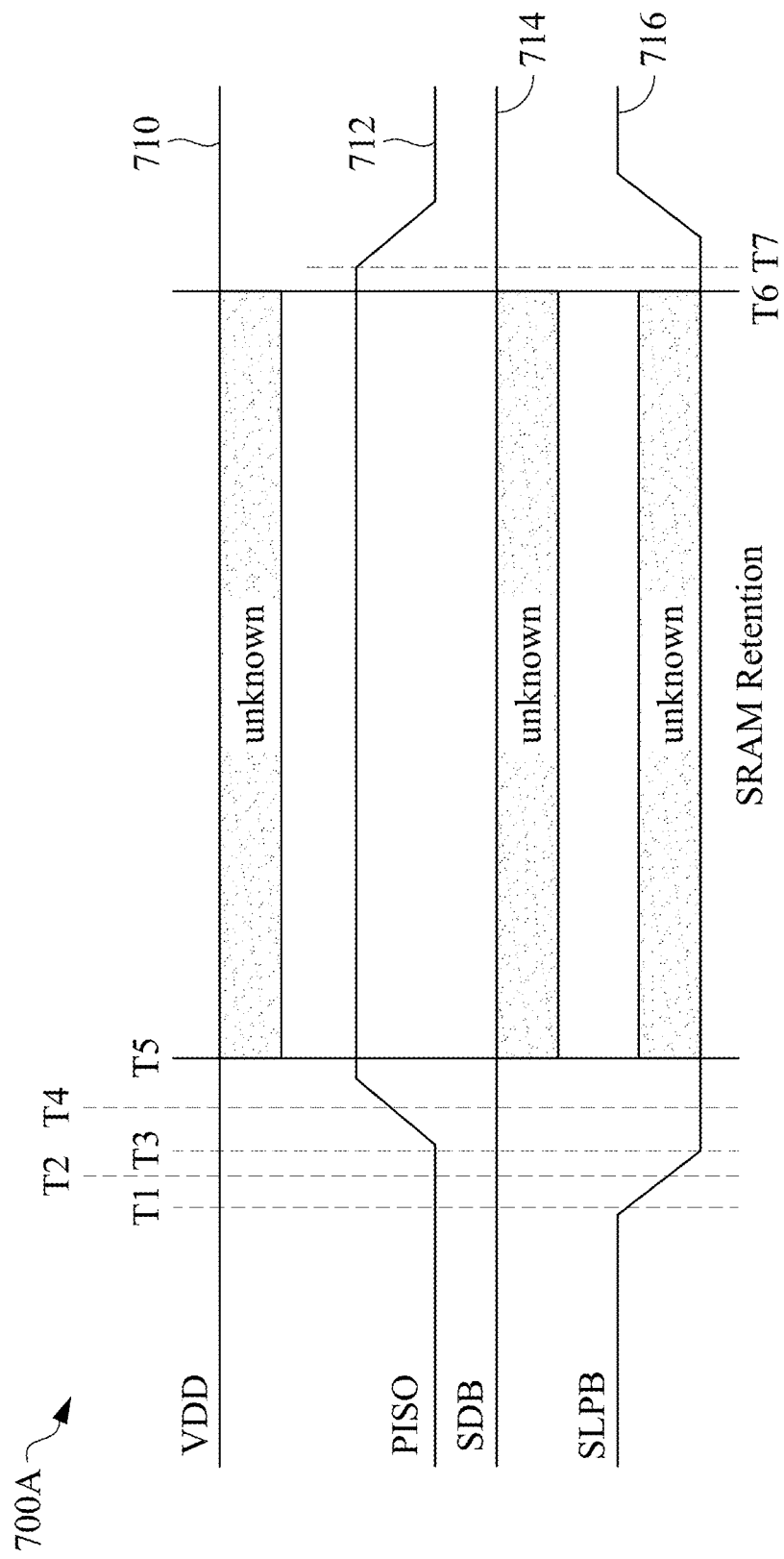
FIGS. 7A-7B are graphs of waveforms of a circuit, in accordance with some embodiments.
Figure 7B:
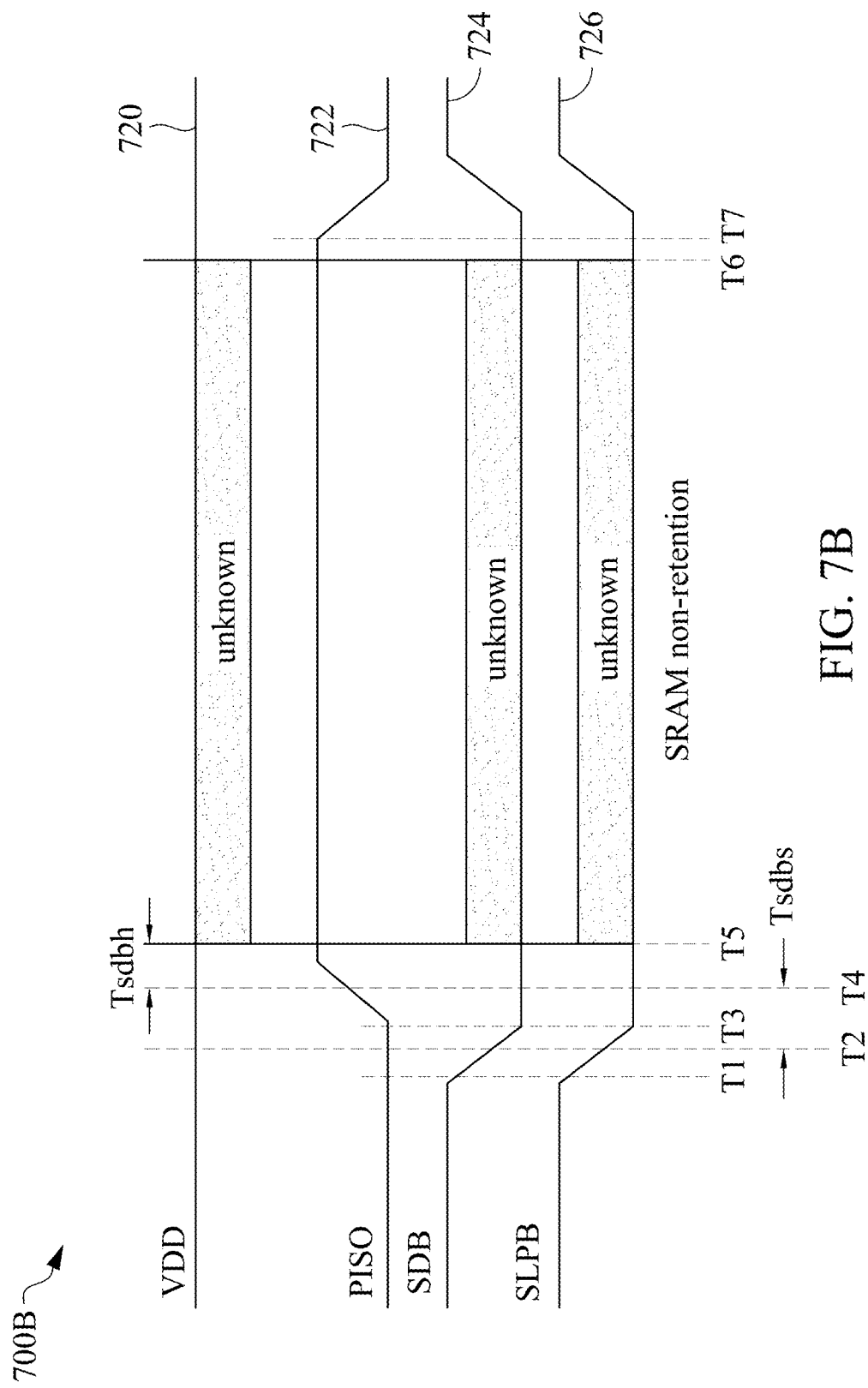

FIGS. 7A-7B are graphs of waveforms 700A-700B of a circuit, in accordance with some embodiments. In some embodiments, waveforms 700A-700B correspond to the waveforms of circuit 100 of FIG. 1 or circuit 600 of FIG. 6.

Waveform 700A is an example of power management circuit 100 and circuit 600 entering the power management mode thereby causing memory circuit 104 to enter the sleep mode (retention state).

Waveform 700A includes curves 710, 712, 714 and 716 of signals in circuit 100 or 600 for the sleep mode (retention). Waveform 700B includes curves 720, 722, 724 and 726 of signals in circuit 100 or 600 for the shut-down mode (non-retention).

In some embodiments, at least curve 710 or 720 represents first supply voltage VDD1 of FIGS. 1 & 6; at least curve 712 or 722 represents control signal PISO of FIGS. 1 & 6; at least curve 714 or 724 represents control signal SDB of FIGS. 1 & 6; and at least curve 716 or 726 represents control signal SLPB of FIGS. 1 & 6. The timing labels of waveforms 700A-700B are similar to the timing labels of waveforms 400A-400E, and similar detailed description is therefore omitted for brevity. In some embodiments, waveform 700A shows a transition from the normal mode (e.g., row 1 in Table 300) to the sleep mode (e.g., row 4 in Table 300).

At time T1, curve 710 is a logical 1, curve 712 is a logical 0, curve 714 is a logical 1, curve 716 is a logical 1, and memory circuit 104 is in the normal mode (e.g., row 1 in Table 300 of FIG. 3). For example, in some embodiments, curves 710, 712, 714 and 716 at time T1 corresponds to row 1 of the entries shown in Table 300.

At time T1, curve 716 begins transitioning from a logical 1 to a logical 0.

At time T3, curve 716 finishes transitioning to a logical 0 which causes control signal SLP_VDD and SLP_VDDM to transition from a logical 0 to a logical 1 thereby causing circuit 100 or 600 to enter the sleep mode (e.g., row 2 of Table 300).

At time T3, curve 712 begins transitioning from a logical 0 to a logical 1, thereby causing power management circuit 100 to transition to the power management mode. In some embodiments, the power management mode of power management circuit 100 is the sleep (retention mode) state (e.g., row 4 of Table 300).

At time T4, curve 712 is half-way between a logical 0 and a logical 1. The change in curve 712 from logical 0 to logical 1, causes the latch circuit 602 to latch the previous state of control signal SLP2 (which is a logical 1) and curve 716 (which is a logical 0).

Since curve 716 (e.g., control signal SLPB) changes states by time T3 and within the setup time Ts window (between time T2 and T4), the previous state of curve 716 is a logical 0 and the previous state of control signal SLP2 is a logical 1. Stated differently, the state of curve 716 between time T2-T4 (e.g., logical 0) and control signal SLP2 (e.g., logical 1) corresponds to the previous state.

At time T5, curve 712 is a logical 1 which causes power management circuit 100 to be in the power management mode thereby causing memory circuit 104 to be in the sleep (retention) mode (e.g., row 4 of Table 300).

Between time T5-T6, memory circuit 104 is in the sleep mode (retention) (e.g., row 4 of Table 300).

At time T7, curve 712 begins transitioning from a logical 1 to a logical 0, thereby causing power management circuit 100 to transition to leave the power management mode.

After time T7, curve 712 is a logical 0, and power management circuit 100 leaves the power management mode. In some embodiments, after time T7, curve 716 transitions to a logical 1 causing power management circuit 100 to return to the normal mode. In some embodiments, the transition of curves 712 and 716 after time T7 causes control signal SLP_VDD and SLP_VDDM to transition from a logical 1 to a logical 0 thereby causing memory circuit 104 to enter the normal mode. For example, in some embodiments, the transition of curves 712 and 716 after time T7 corresponds to a transition from row 4 to row 1 of the entries shown in Table 400.

FIG. 7B is a graph of waveform 700B of a circuit, in accordance with some embodiments. Waveform 700B is an example of power management circuit 100 and circuit 600 entering the power management mode thereby causing memory circuit 104 to enter the shut-down mode (non-retention state). In some embodiments, waveform 700B shows a transition from the normal mode (e.g., row 1 in Table 300) to the shut-down (e.g., row 5 in Table 300).

At time T1, curve 720 is a logical 1, curve 722 is a logical 0, curve 724 is a logical 1, curve 726 is a logical 1, and memory circuit 104 is in the normal mode (e.g., row 1 in Table 300 of FIG. 3). For example, in some embodiments, curves 720, 722, 724 and 726 at time T1 corresponds to row 1 of the entries shown in Table 300.

At time T1, curve 724 and curve 726 begin transitioning from a logical 1 to a logical 0.

At time T3, curve 724 and curve 726 finish transitioning to a logical 0 which causes control signal SLP_VDD and SLP_VDDM to transition from a logical 0 to a logical 1 thereby causing circuit 100 or 600 to enter the shut-down mode (e.g., row 3 of Table 300).

At time T3, curve 722 begins transitioning from a logical 0 to a logical 1, thereby causing power management circuit 100 to transition to the power management mode. In some embodiments, the power management mode of power management circuit 100 is the shut-down (non-retention mode) state (e.g., row 5 of Table 300).

At time T4, curve 722 is half-way between a logical 0 and a logical 1. The change in curve 722 from logical 0 to logical 1, causes the latch circuit 602 to latch the previous state of control signal SLP2 (which is a logical 1) and curve 726 (which is a logical 0), and causes latch circuit 222 to latch the previous state of control signal SD2 (which is a logical 1) and curve 724 (which is a logical 0). For at least similar reasons as stated above for FIG. 7A, the state of curve 726 between time T2-T4 (e.g., logical 0) and control signal SLP2 (e.g., logical 1) corresponds to the previous state.

Since curve 724 (e.g., control signal SDB) changes states by time T3 and within the setup time Ts window (between time T2 and T4), the previous state of curve 724 is a logical 0 and the previous state of control signal SD2 is a logical 1. Stated differently, the state of curve 724 between time T2-T4 (e.g., logical 0) and control signal SD2 (e.g., logical 1) corresponds to the previous state.

At time T5, curve 722 is a logical 1 which causes power management circuit 100 to be in the power management mode thereby causing memory circuit 104 to be in the shut-down (non-retention) mode (e.g., row 5 of Table 300).

Between time T5-T6, memory circuit 104 is in the shut-down mode (non-retention) (e.g., row 5 of Table 300).

At time T7, curve 722 begins transitioning from a logical 1 to a logical 0, thereby causing power management circuit 100 to transition to leave the power management mode.

After time T7, curve 722 is a logical 0, and power management circuit 100 leaves the power management mode. In some embodiments, after time T7, curve 724 and curve 726 transition to a logical 1 causing power management circuit 100 to return to the normal mode. In some embodiments, the transition of curves 722, 724 and 726 after time T7 causes control signals SD_VDDM, SLP_VDD and SLP_VDDM to transition from a logical 1 to a logical 0, thereby causing memory circuit 104 to enter the normal mode. For example, in some embodiments, the transition of curves 722, 724 and 726 after time T7 corresponds to a transition from row 5 to row 1 of the entries shown in Table 400.

Circuit

Figure 8:
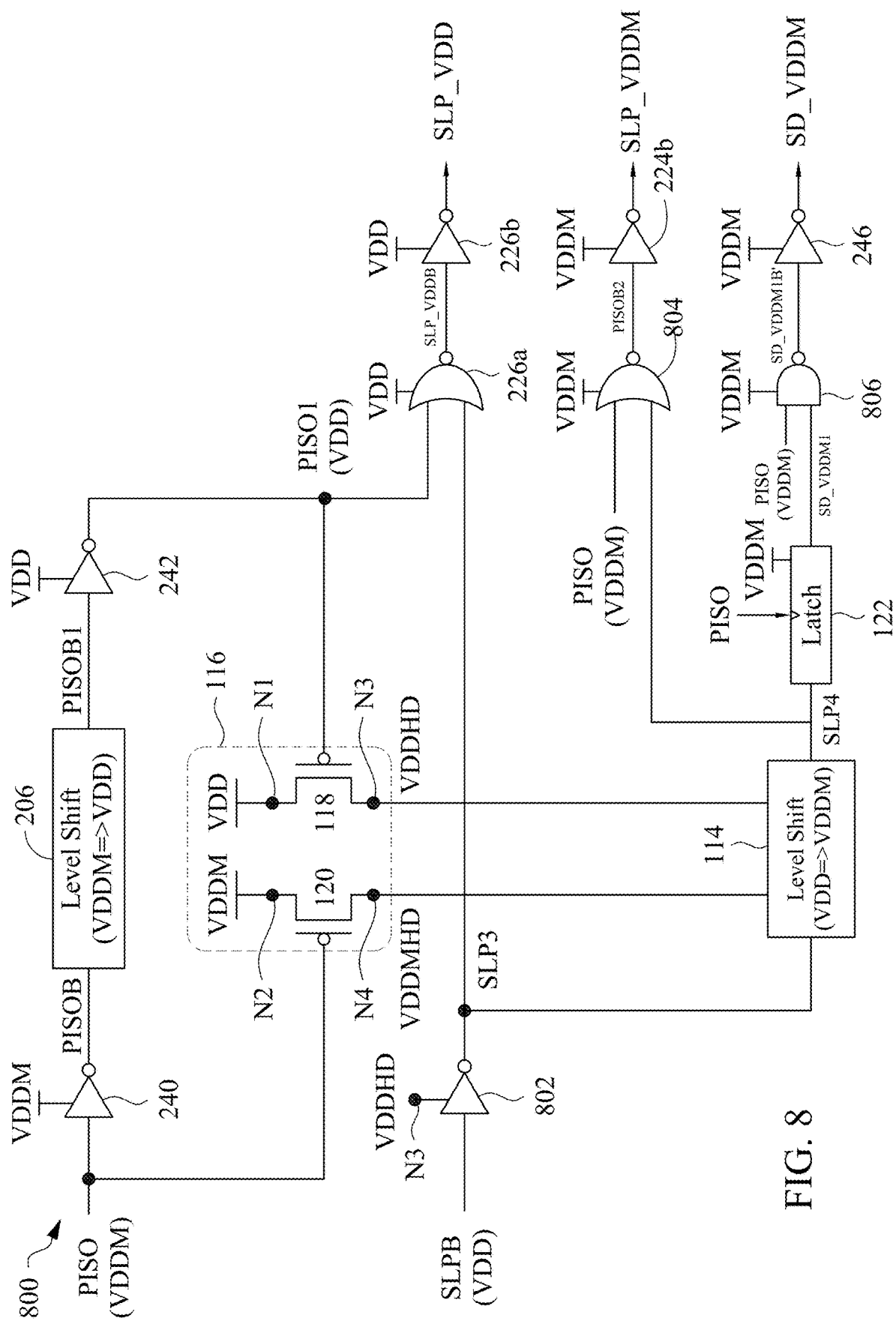
FIG. 8 is a circuit diagram of a circuit, in accordance with some embodiments.

FIG. 8 is a circuit diagram of a circuit 800, in accordance with some embodiments.

Circuit 800 is a variation of circuit 200 of FIG. 2, and similar detailed description is therefore omitted. In comparison with circuit 200 of FIG. 2, circuit 800 does not include control signal SDB, and the functionality of control signal SDB from FIG. 2 is implemented in circuit 800 by the use of control signal PISO.

In some embodiments, by removing control signal SDB, the functionality of control signal SDB from FIG. 2 is implemented in circuit 800 by the use of control signal PISO. For, example, in some embodiments, control signal PISO causes control signals SLP_VDD and SLP_VDDM to be a logical 1 when PISO is enabled or is a logical 1, thereby causing memory circuit 104 to be in the sleep mode (retention mode).

In comparison with circuit 200 of FIG. 2, circuit 800 does not include level shifter circuit 112. In comparison with circuit 200 of FIG. 2, an inverter 802 of FIG. 8 replaces inverter 108 and NAND logic gate 110, a NOR logic gate 804 of FIG. 8 replaces NOR logic gate 224a, and a NAND logic gate 806 replaces inverter 244, and similar detailed description is therefore omitted. Circuit 800 is an embodiment of control circuit 102a of FIG. 1.

Inverter 802 is coupled to at least level shifter circuit 114, NOR logic gate 226a or header circuit 116 by node N3. Inverter 802 is configured to generate control signal SLP3 in response to control signal SLPB. In some embodiments, control signal SLP3 has the first voltage swing. In some embodiments, control signal SLP3 is inverted from control signal SLPB. An input terminal of inverter 802 is configured to receive control signal SLPB. An output terminal of inverter 802 is coupled to the input of level shifter circuit 114 and the second input terminal of NOR logic gate 226a. The output terminal of inverter 802 is configured to output control signal SLP3 to the input of level shifter circuit 114 and the second input terminal of NOR logic gate 226a. A voltage supply node of inverter 802 is coupled to node N3 and configured to receive first supply voltage VDD1. In some embodiments, inverter 802 is coupled to the drain of PMOS transistor 118 by node N3.

NOR logic gate 226a of FIG. 8 is configured to generate control signal SLP_VDDB in response to control signal SLP3 and PISO1. In some embodiments, control signal SLP3 is similar to control signal SLP1 of FIG. 2, and therefore the operation of NOR logic gate 226a of FIG. 8 is similar to the operation of NOR logic gate 226a of FIG. 2, and similar detailed description is therefore omitted. Inverter 226b of FIG. 8 is configured to generate control signal SLP_VDD in response to control signal SLP_VDDB.

Level shifter circuit 114 of FIG. 8 is configured to generate control signal SLP4 in response to control signal SLP3. In some embodiments, control signal SLP4 has the second voltage swing. In some embodiments, control signal SLP3 is similar to control signal SD1 of FIG. 2, control signal SLP4 is similar to control signal SD2 of FIG. 2, and therefore the operation of level shifter circuit 114 of FIG. 8 is similar to the operation of level shifter circuit 114 of FIGS. 1-2, and similar detailed description is therefore omitted.

Latch circuit 122 of FIG. 8 is configured to generate control signal SD_VDDM1 in response to control signal PISO and control signal SLP4. In some embodiments, control signal SLP4 is similar to control signal SD2 of FIG. 2, and therefore the operation of latch circuit 122 of FIG. 8 is similar to the operation of latch circuit 122 of FIGS. 1-2, and similar detailed description is therefore omitted.

NOR logic gate 804 is coupled between inverter 224b and level shifter circuit 114. NOR logic gate 804 is configured to generate control signal PISOB2 in response to control signal PISO and control signal SLP4. In some embodiments, control signal PISOB2 has the second voltage swing. In some embodiments, control signal PISOB2 is inverted from control signal PISO. In some embodiments, control signal PISOB2 is equal to control signal PISOB. An input terminal of NOR logic gate 804 is configured to receive control signal PISOB. An input terminal of NOR logic gate 804 is coupled to an output terminal of level shifter circuit 114, and is configured to receive control signal SLP4. An output terminal of NOR logic gate 804 is coupled to the input terminal of inverter 224b of FIG. 8, and configured to output control signal PISOB2 to the input terminal of inverter 224b. A voltage supply node (unlabeled) of NOR logic gate 804 is configured to receive second supply voltage VDDM1.

NAND logic gate 806 is coupled between latch circuit 122 and inverter 246. NAND logic gate 806 is configured to generate a control signal SD_VDDM1B' in response to control signal PISO and control signal SD_VDDM1. In some embodiments, control signal SD_VDDM1B' has the second voltage swing. An input terminal of NAND logic gate 806 is configured to receive control signal PISO. An input terminal of NAND logic gate 806 is coupled to an output terminal of latch circuit 122, and is configured to receive control signal SD_VDDM1. An output terminal of NAND logic gate 806 is coupled to the input terminal of inverter 246 of FIG. 8, and configured to output control signal SD_VDDM1B' to the input terminal of inverter 246. A voltage supply node (unlabeled) of NAND logic gate 806 is configured to receive second supply voltage VDDM1.

Inverter 224b of FIG. 8 is configured to generate control signal SLP_VDDM in response to control signal PISOB2. In some embodiments, control signal SLP_VDDM is inverted from control signal PISOB2. In some embodiments, control signal SLP_VDDM is a delayed version of control signal PISO. In some embodiments, control signal PISOB2 is similar to control signal SLP_VDDMB of FIG. 2, and therefore the operation of inverter 224b of FIG. 8 is similar to the operation of inverter 224b of FIG. 2, and similar detailed description is therefore omitted.

Truth Table

FIG. 9 is a truth table 900 of the circuit 100 in FIG. 1 or circuit 800 in FIG. 8, in accordance with some embodiments. The values and format of table 900 are provided as an example, and other values and/or formats for Table 900 are within the scope of the present disclosure.

As shown in row 1 of truth table 900 of FIG. 9, if control signal PISO is a logical 0 and control signal SLPB is a logical 1, then power management circuit 102 or circuit 800 cause control signals SLP_VDD, SLP_VDDM and SD_VDDM to each be a logical 0 thereby causing memory circuit 104 to be in a normal mode.

As shown in row 2 of truth table 900 of FIG. 9, if control signal PISO is a logical 0 and control signal SLPB is a logical 0, then power management circuit 102 or circuit 800 cause control signals SLP_VDD and SLP_VDDM to each be a logical 1, and control signal SD_VDDM to be a logical 0 thereby causing memory circuit 104 to be in a sleep mode (retention mode).

As shown in rows 3 and 4 of truth table 900 of FIG. 9, when control signal PISO is a logical 1 causes memory circuit 104 to automatically be in either the sleep mode (retention mode) or the shutdown mode (non-retention mode) thereby reducing the power consumption of at least circuit 100 or 800.

As shown in row 3 of truth table 900 of FIG. 9, if control signal PISO is a logical 1 and control signal SLPB is a logical 1, then power management circuit 102 or circuit 800 cause control signals SLP_VDD and SLP_VDDM to each be a logical 1, and control signal SD_VDDM to be a logical 0 thereby causing memory circuit 104 to be in the sleep mode (retention mode). In some embodiments, for at least row 3 of truth table 900, control signal SLPB is in the floating or high impedance state (Z*) after signal SD2 is latched by latch circuit 122 of FIG. 8 and the first supply voltage VDD1 is turned off by control circuit 1200 (FIG. 12) thereby causing at least level shifter circuit 114 in FIG. 8 to be disabled.

As shown in row 4 of truth table 900 of FIG. 9, if control signal PISO is a logical 1 and control signal SDB is a logical 0, then power management circuit 102 or circuit 800 cause each of control signals SLP_VDD, SLP_VDDM and SD_VDDM to be a logical 1 thereby causing memory circuit 104 to be in the shut-down mode (non-retention mode). In some embodiments, for at least row 4 of truth table 900, control signal SLPB is in the floating or high impedance state (Z*) after signal SD2 is latched by latch circuit 122 of FIG. 8 and the first supply voltage VDD1 is turned off by control circuit 1200 (FIG. 12) thereby causing level shifter circuit 114 in FIG. 8 to be disabled.

Waveforms

Figure 10A:
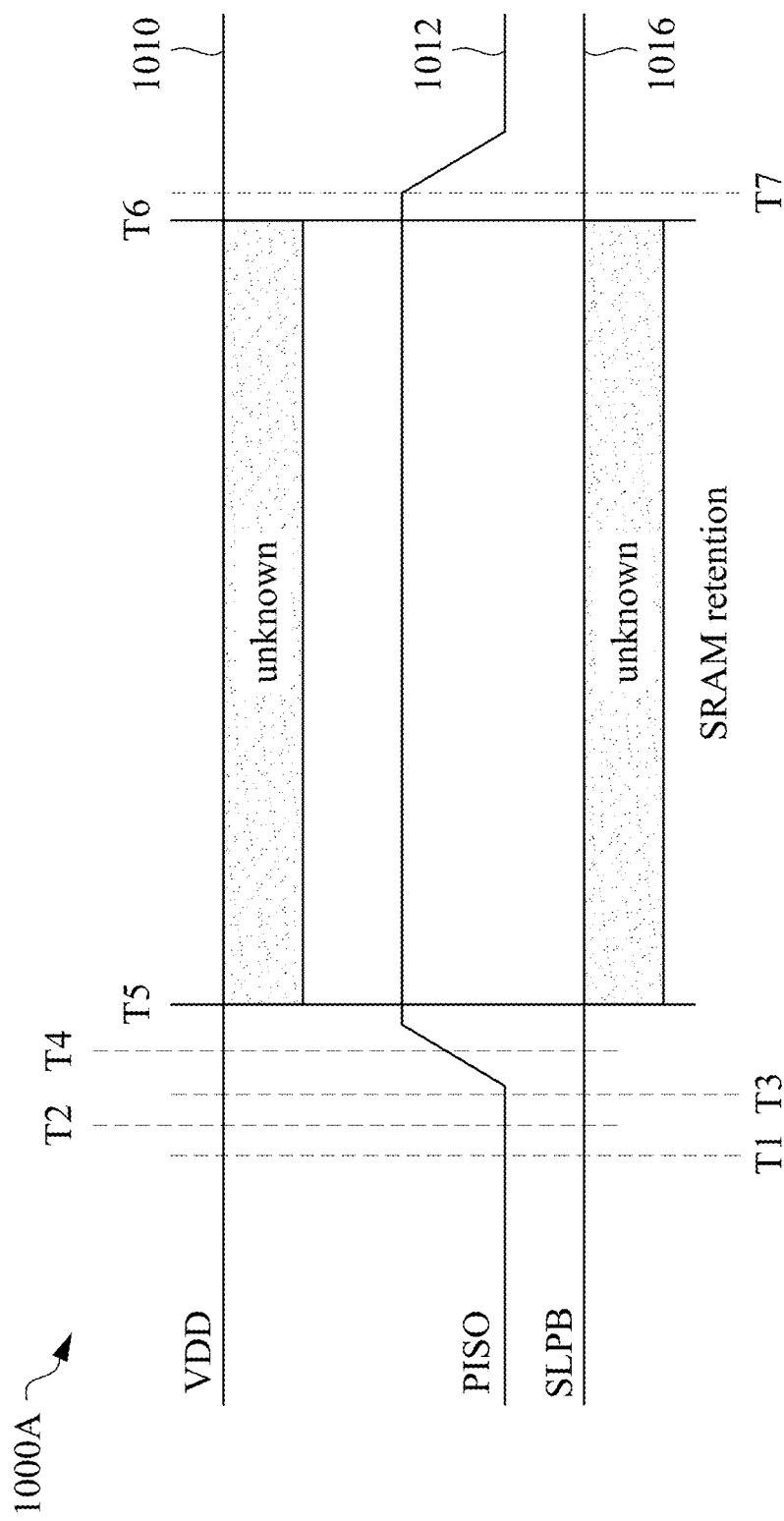
FIGS. 10A-10B are graphs of waveforms of a circuit, in accordance with some embodiments.
Figure 10B:
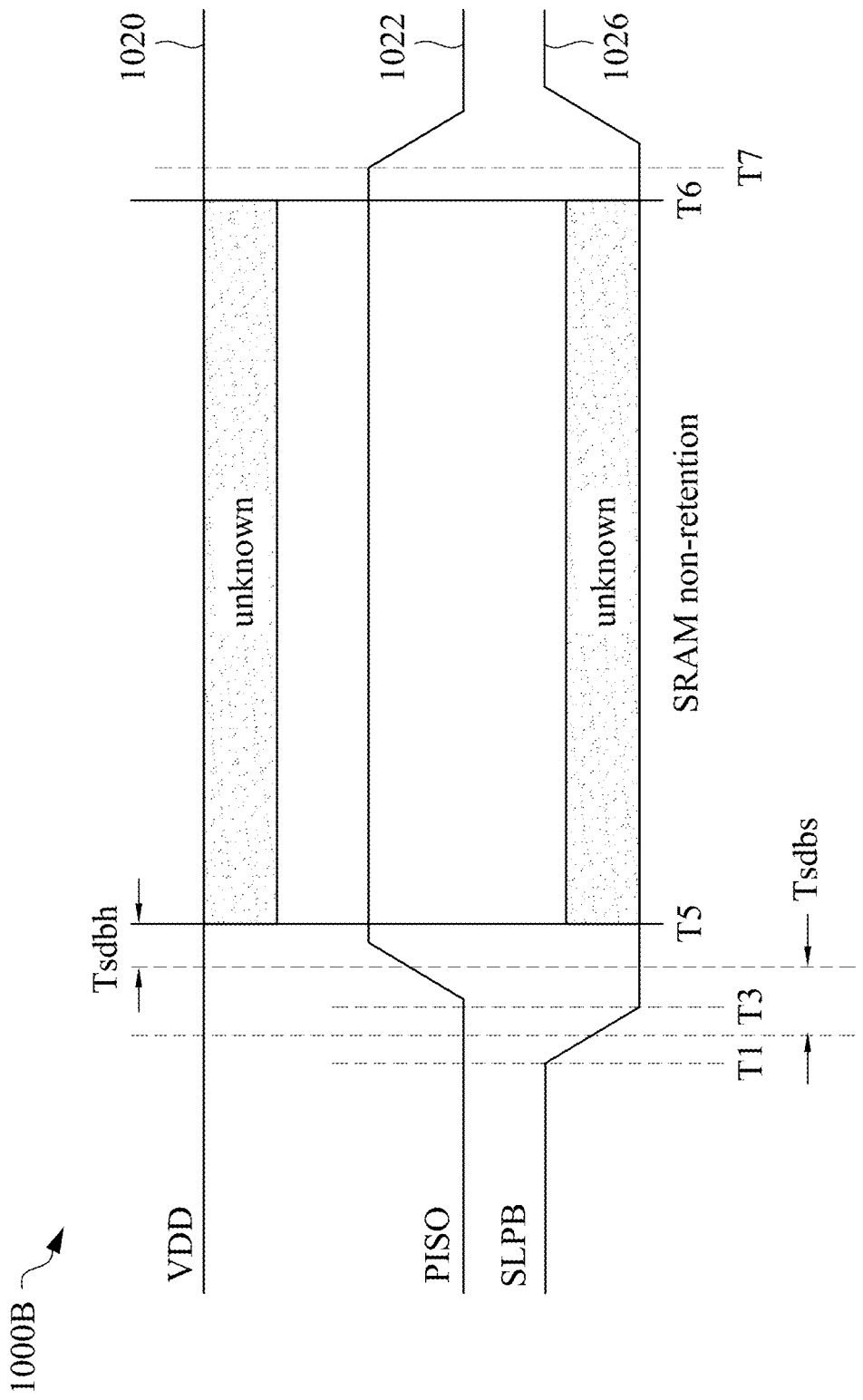

FIGS. 10A-10B are graphs of waveforms 1000A-1000B of a circuit, in accordance with some embodiments. In some embodiments, waveforms 1000A-1000B correspond to the waveforms of circuit 100 of FIG. 1 or circuit 800 of FIG. 8.

Waveform 1000A includes curves 1010, 1012 and 1016 of signals in circuit 100 or 800 for the sleep mode (retention). In some embodiments, at least curve 1010 or 1020 represents first supply voltage VDD1 of FIGS. 1 & 8; at least curve 1012 or 1022 represents control signal PISO of FIGS. 1 and 8; and at least curve 1016 or 1026 represents control signal SLPB of FIGS. 1 and 8.

At time T1, curve 1014 is a logical 1 and curve 1012 is a logical 0.

At time T3, curve 1012 transitions from a logical 0 to a logical 1 which causes control signal SLP_VDD and SLP_VDDM to transition from a logical 0 to a logical 1 thereby causing memory circuit 104 to enter the sleep mode (retention). For example, in some embodiments, this transition of curve 1012 corresponds to a transition from row 1 to row 3 of the entries shown in Table 900.

At time T5, curve 1012 is a logical 1.

Between time T5-T6, memory circuit 104 is in the sleep mode (retention).

At time T7, curve 1012 transitions from a logical 1 to a logical 0. In some embodiments, the transition of curve 1012 from a logical 1 to a logical 0 causes control signal SLP_VDD and SLP_VDDM to transition from a logical 1 to a logical 0 thereby causing memory circuit 104 to enter the normal mode. For example, in some embodiments, this transition of curve 1012 corresponds to a transition from row 3 to row 1 of the entries shown in Table 900.

After time T7, curve 1012 is a logical 0.

Waveform 1000B includes curves 1020, 1022 and 1026 of signals in circuit 100 or 800 for the shut-down mode (non-retention).

At time T1, curve 1022 is a logical 0, and curve 1024 transitions from a logical 1 to a logical 0.

At time T3, curve 1024 is a logical 0, and curve 1022 transitions from a logical 0 to a logical 1 which causes control signal SLP_VDD, SLP_VDDM and SD_VDDM to transition from a logical 0 to a logical 1 thereby causing memory circuit 104 to enter the shut-down mode (non-retention). For example, in some embodiments, this transition of curve 1022 and curve 1024 corresponds to a transition from row 1 to row 4 of the entries shown in Table 900.

At time T5, curve 1022 is a logical 1.

Between time T5-T6, memory circuit 104 is in the shut-down mode (non-retention).

At time T7, curve 1022 transitions from a logical 1 to a logical 0. In some embodiments, the transition of curve 1022 from a logical 1 to a logical 0 causes control signal SLP_VDD and SLP_VDDM to transition from a logical 1 to a logical 0 thereby causing memory circuit 104 to enter either the normal mode. For example, in some embodiments, this transition of curve 1022 corresponds to a transition from row 4 to row 1 of the entries shown in Table 900. In some embodiments, the transition of curve 1022 from a logical 1 to a logical 0 and the transition of curve 1026 from a logical 0 to a logical 1 causes control signal SD_VDDM to transition from a logical 1 to a logical 0, thereby causing memory circuit 104 to enter the sleep mode. For example, in some embodiments, this transition of curve 1022 corresponds to a transition from row 4 to row 2 of the entries shown in Table 900.

After time T7, curve 1022 is a logical 0.

Level Shifter Circuit

Figure 11:
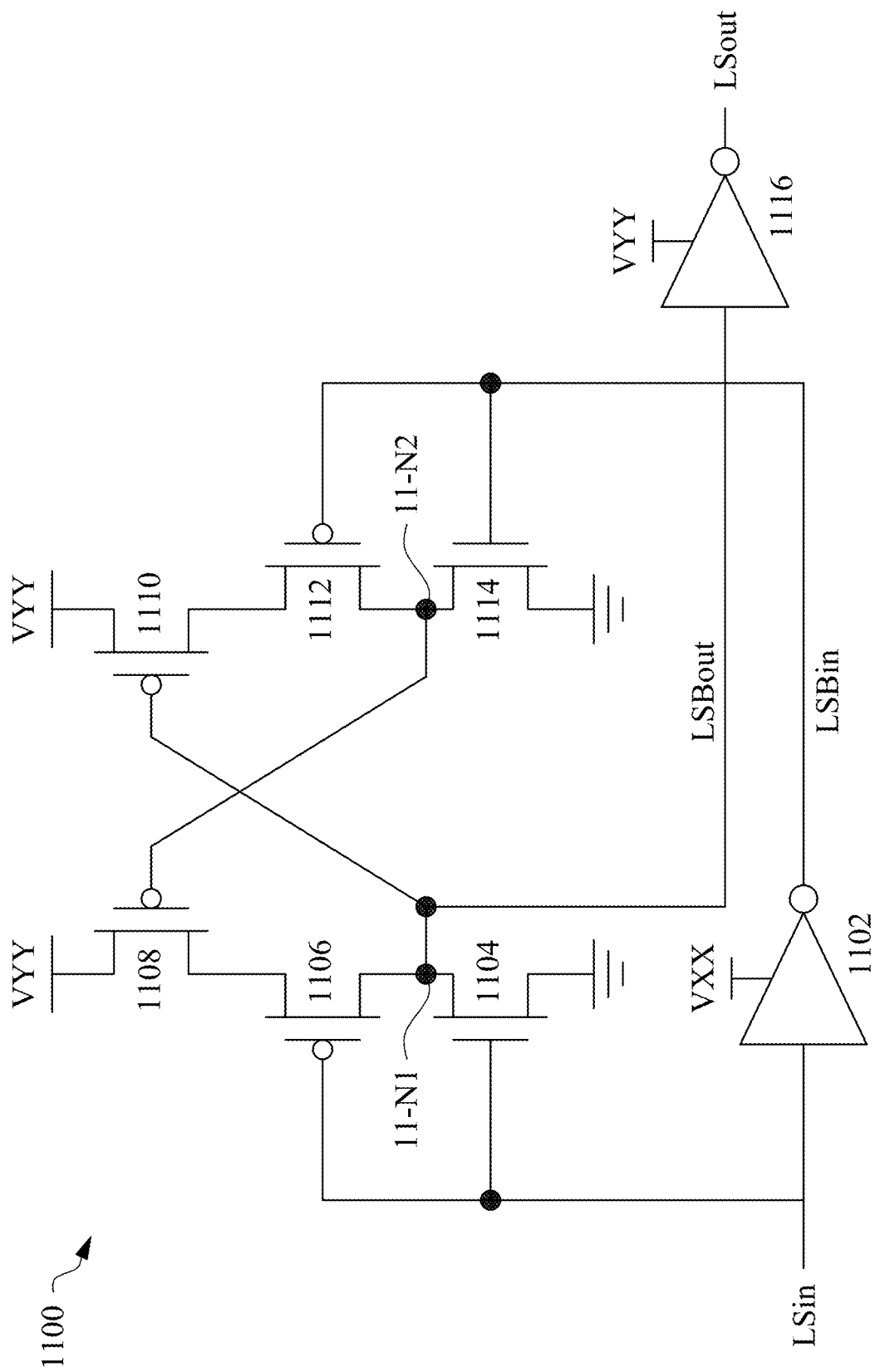
FIG. 11 is a circuit diagram of a level shifter circuit, in accordance with some embodiments.

FIG. 11 is a circuit diagram of a level shifter circuit 1100, in accordance with some embodiments.

Level shifter circuit 1100 is an embodiment of at least level shifter circuit 106, 112, 114, 206 or 506, and similar detailed description is omitted.

Level shifter circuit 1100 is configured to receive a signal LSin, and to generate a signal LSout. Level shifter circuit 1100 is a level shifter circuit configured to shift signals from a first voltage domain VXX that uses supply voltage VXX1 to a second voltage domain VYY that uses supply voltage VYY1.

In some embodiments, the first voltage domain VXX is voltage domain VDD, the supply voltage VXX1 is supply voltage VDD1, the second voltage domain VYY is voltage domain VDDM, and the supply voltage VYY1 is supply voltage VDDM1, and level shifter circuit 1100 is configured to shift signals from voltage domain VDD that uses supply voltage VDD1 to voltage domain VDDM that uses supply voltage VDDM1. For example, in these embodiments, level shifter circuit 1100 is an embodiment of at least level shifter circuit 112 or 114, and similar detailed description is omitted. For example, in these embodiments, when level shifter circuit 1100 is an embodiment of level shifter circuit 112, signal LSin corresponds to at least control signal SLP1, and signal LSout corresponds to at least control signal SLP2. For example, in these embodiments, when level shifter circuit 1100 is an embodiment of level shifter circuit 114, signal LSin corresponds to at least control signal SD1 or SLP3, and signal LSout corresponds to at least control signal SD2 or SLP4.

In some embodiments, the first voltage domain VXX is voltage domain VDDM, the supply voltage VXX1 is supply voltage VDDM1, the second voltage domain VYY is voltage domain VDD, and the supply voltage VYY1 is supply voltage VDD1, and level shifter circuit 1100 is configured to shift signals from voltage domain VDDM that uses supply voltage VDDM1 to voltage domain VDD that uses supply voltage VDD1. For example, in these embodiments, level shifter circuit 1100 is an embodiment of at least level shifter circuit 106, 206 or 506, and similar detailed description is omitted. For example, in these embodiments, when level shifter circuit 1100 is an embodiment of level shifter circuit 106, signal LSin corresponds to at least control signal PISO, and signal LSout corresponds to at least control signal PISO1. For example, in these embodiments, when level shifter circuit 1100 is an embodiment of level shifter circuit 206, signal LSin corresponds to at least control signal PISOB, and signal LSout corresponds to at least control signal PISOB1. For example, in these embodiments, when level shifter circuit 1100 is an embodiment of level shifter circuit 506, signal LSin corresponds to at least signal preQ, and signal LSout corresponds to at least control signal QBvdd.

Level shifter circuit 1100 is configured to receive signal LSin on an input terminal (not labelled), and to output a signal LSout on an output terminal (not labeled). Signal LSin corresponds to an input signal of level shifter circuit 1100, and signal LSout corresponds to an output signal of level shifter circuit 1100. Level shifter circuit 1100 is configured to generate signal LSout based on signal LSin.

Signal LSout corresponds to a level shifted version of signal LSin. In some embodiments, a voltage level of signal LSin of level shifter circuit 1100 is less than a voltage level of the signal LSout of level shifter circuit 1100. In some embodiments, the voltage level of signal LSin of level shifter circuit 1100 is greater than the voltage level of signal LSout of level shifter circuit 1100.

Level shifter circuit 1100 includes an inverter 1102, an NMOS transistor 1104, a PMOS transistor 1106, a PMOS transistor 1108, a PMOS transistor 1110, a PMOS transistor 1112, an NMOS transistor 1114 and an inverter 1116.

An input terminal of inverter 1102 is configured to receive a signal LSin. Each of the input terminal of inverter 1102, a gate terminal of PMOS transistor 1106, and a gate terminal of NMOS transistor 1104 are coupled to each other. An output terminal of inverter 1102 is configured to output a signal LSBin. In some embodiments, signal LSBin is an inverted version of signal LSin. Inverter 1102 is configured to generate signal LSBin based on signal CKPI. Inverter 1102 is coupled to voltage supply VXX. In some embodiments, inverter 1102 is a CMOS inverter type coupled to voltage supply VXX and reference voltage supply VSS.

The gate terminal of NMOS transistor 1104 is configured to receive signal LSin. A source terminal of NMOS transistor 1104 is coupled to reference voltage supply VSS. Each of a drain terminal of NMOS transistor 1104, a drain terminal of PMOS transistor 1106, a gate terminal of PMOS transistor 1110, and an input terminal of inverter 1116 are coupled together at a node 11-N1.

The gate terminal of PMOS transistor 1106 is configured to receive signal LSin. A source terminal of PMOS transistor 1106 is coupled to the drain terminal of PMOS transistor 1108.

A source terminal of PMOS transistor 1108 is coupled with voltage supply VYY. Each of a gate terminal of PMOS transistor 1108, a drain terminal of NMOS transistor 1114, and a drain terminal of PMOS transistor 1112 are coupled to each other at a node 11-N2. The gate terminal of PMOS transistor 1108 is configured to receive a voltage at node 11-N2. In some embodiments, PMOS transistor 1108 is turned on or off based on the voltage at node 11-N2.

NMOS transistor 1104, PMOS transistor 1106 and PMOS transistor 1108 are configured to set the voltage of node 11-N1 which corresponds to signal LSBout. For example, in some embodiments, if NMOS transistor 1104 is turned on, NMOS transistor 1104 is configured to pull node 11-N1 towards reference voltage VSS. For example, in some embodiments, if PMOS transistors 1106 and 1108 are turned on, PMOS transistors 1106 and 1108 are configured to pull node 11-N1 towards supply voltage VYY1.

A source terminal of PMOS transistor 1110 is coupled with voltage supply VYY. A drain terminal of PMOS transistor 1110 is coupled with a source terminal of PMOS transistor 1112. The gate terminal of PMOS transistor 1110 is coupled to at least node 11-N1. A voltage at node 11-N1 corresponds to a signal LSBout. The gate terminal of PMOS transistor 1110 is configured to receive signal LSBout. In some embodiments, PMOS transistor 1110 is turned on or off based on the voltage at node 11-N1 which corresponds to signal LSBout.

The gate terminal of PMOS transistor 1112 is configured to receive signal LSBin from inverter 1102. Each of the gate terminal of PMOS transistor 1112, a gate terminal of NMOS transistor 1114 and the output terminal of inverter 1102 are coupled to each other.

The gate terminal of NMOS transistor 1114 is configured to receive signal LSBin from inverter 1102. A source terminal of NMOS transistor 1114 is coupled to reference voltage supply VSS.

NMOS transistor 1114, PMOS transistor 1110 and PMOS transistor 1112 are configured to set the voltage of node 11-N1 which corresponds to signal LSBout. For example, in some embodiments, if NMOS transistor 1114 is turned on, NMOS transistor 1114 is configured to pull node 11-N2 towards reference voltage VSS. For example, in some embodiments, if PMOS transistors 1110 and 1112 are turned on, PMOS transistors 1110 and 1112 are configured to pull node 11-N2 towards supply voltage VYY1.

The input terminal of inverter 1116 is configured to receive signal LSBout from node 11-N1. An output terminal of inverter 1116 is configured to output signal LSout. In some embodiments, signal LSout is an inverted version of signal LSBout. Inverter 1116 is configured to generate signal LSout based on signal LSBout. Inverter 1116 is coupled to voltage supply VYY. In some embodiments, inverter 1116 is a CMOS inverter type coupled to voltage supply VYY and reference voltage VSS. Signal LSout corresponds to the output signal of level shifter circuit 1100. Signal LSout is a level shifted version of signal LSin.

Other configurations and types of level shifters for level shifter circuit 1100 are within the scope of the present disclosure.

Figure 12:
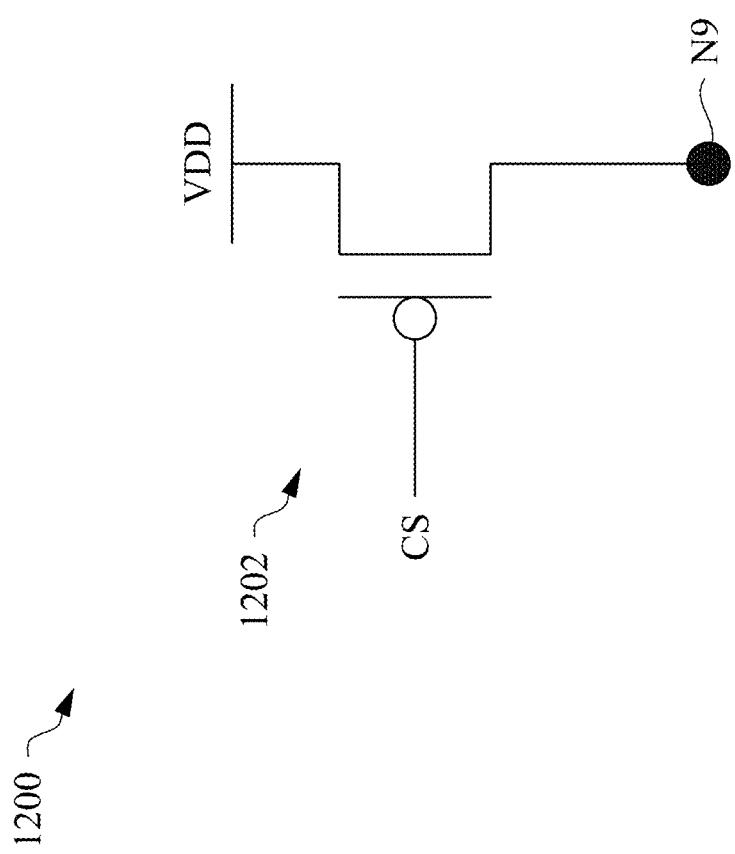
FIG. 12 is a circuit diagram of a circuit, in accordance with some embodiments.

FIG. 12 is a circuit diagram of a circuit 1200, in accordance with some embodiments.

Circuit 1200 is configured to turn off or on supply voltage VDD provided to circuit 100, 200, 500, 600, 800 and 1100.

Circuit 1200 includes a PMOS transistor 1202 coupled to a node N9. In some embodiments, PMOS transistor 1202 is configured to provide supply voltage VDD1 to node N9 when turned on or enabled by a control signal CS. In some embodiments, PMOS transistor 1202 is configured to not provide supply voltage VDD1 to node N9 when turned off or disabled by control signal CS. In some embodiments, control signal CS is control signal PISO. In some embodiments, control signal CS is a delayed version of control signal PISO.

For example, in some embodiments, if control signal CS is a logical 0, then PMOS transistor 1202 is turned on and pulls node N9 to supply voltage VSS1. In some embodiments, control signal is a logical 0, when control signal PISO is a logical 0 thereby causing power management circuit 100 to not be in the power management mode.

For example, in some embodiments, if control signal CS is a logical 1, then PMOS transistor 1202 is turned off, and supply voltage VSS is not provided to node N9 by PMOS transistor 1202. In some embodiments, control signal is a logical 1, when control signal PISO is a logical 1 thereby causing power management circuit 100 to be in the power management mode.

A source terminal of PMOS transistor 1202 is configured as a voltage supply node configured to receive supply voltage VDD1 from voltage supply VDD. A gate terminal of PMOS transistor 1202 is configured to receive control signal CS. In some embodiments, control signal CS turns on or turns off PMOS transistor 1202.

A drain terminal of PMOS transistor 1202 is coupled to node N9. In some embodiments, the drain terminal of PMOS transistor 1202 is coupled to nodes N1 and N7 in FIGS. 1-2, 5-6 and 8. In some embodiments, the drain terminal of PMOS transistor 1202 is coupled to the voltage supply node of at least OR logic gate 126, inverter 242, inverter 226b, NOR logic gate 226a, level shifter circuit 106, level shifter circuit 206, level shifter circuit 506 or level shifter circuit 1100.

Method

Figure 13:
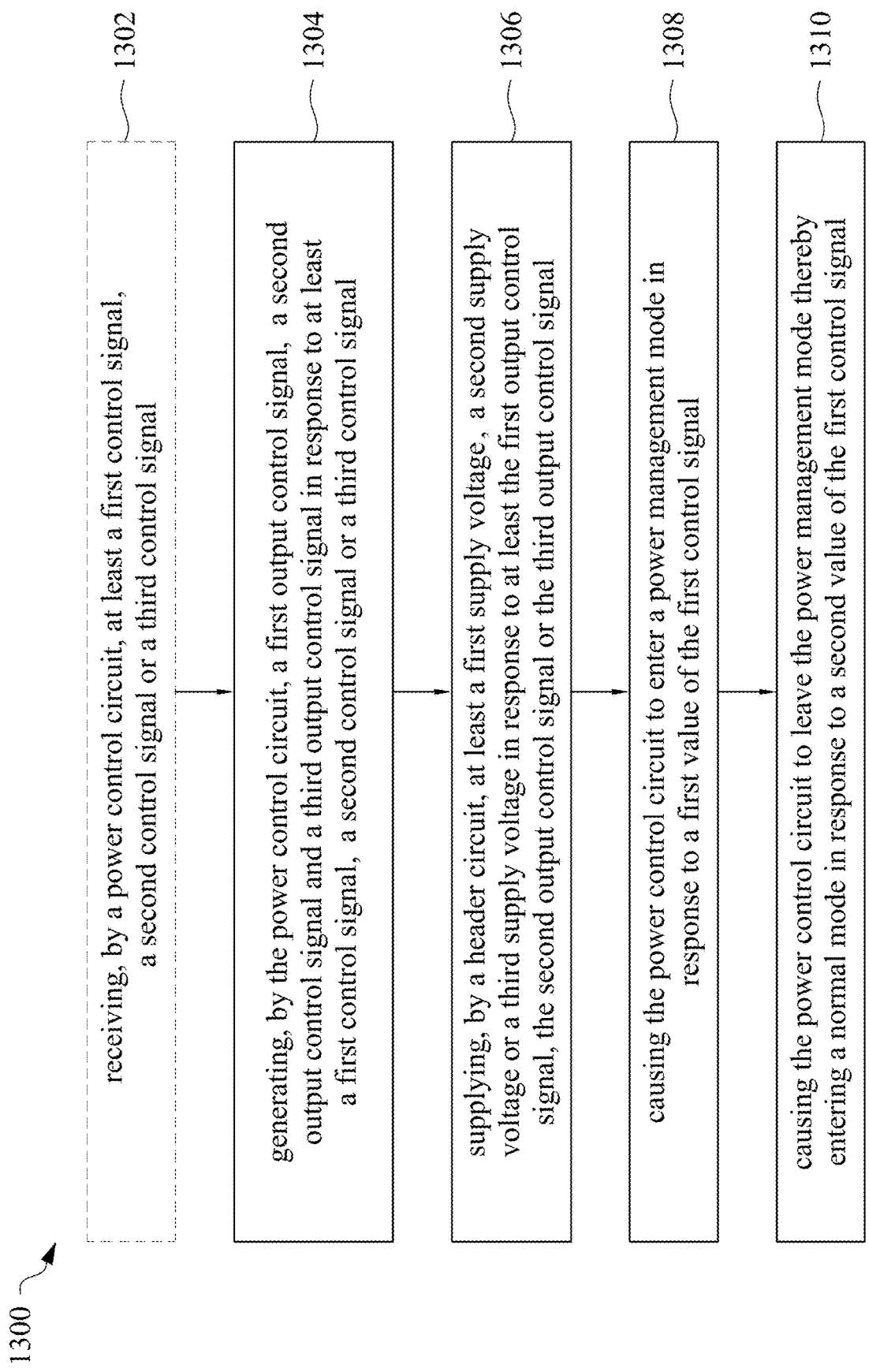
FIG. 13 is a flowchart of a method of operating a circuit, in accordance with some embodiments.

FIG. 13 is a flowchart of a method of operating a circuit, such as circuit 100-200, 500-600, 800 or 1100-1200 of corresponding FIG. 1, 2, 5-6, 8 or 11-12, in accordance with some embodiments. It is understood that additional operations may be performed before, during, and/or after the method 1300 depicted in FIG. 13, and that some other processes may only be briefly described herein. It is understood that method 1300 utilizes features of one or more of circuits 100-200, 500-600, 800 or 1100-1200 of corresponding FIG. 1-2, 5-6, 8 or 11-12, or one or more features of truth tables 300 or 900 of corresponding FIG. 3 or 9, or one or more features of waveforms 400A-400D, 700A-700B or 1000A-1000B of corresponding FIG. 4A-4D, 7A-7B or 10A-10B.

In operation 1302 of method 1300, at least a first control signal (PISO), a second control signal (SLPB) or a third control signal (SDB) is received by a power control circuit (circuit 100, 102 or 102a). In some embodiments, the power control circuit of method 1300 is coupled to a first voltage supply having a first voltage and a second voltage supply having a second voltage.

In operation 1304 of method 1300, a first output control signal (SD_VDDM), a second output control signal (SLP_VDDM) and a third output control signal (SLP_VDD) are generated by power control circuit in response to at least a first control signal (PISO), a second control signal (SLPB) or a third control signal (SDB). In some embodiments, at least the first voltage (VDDM1) or the first control signal (PISO) having a first voltage swing (VDDM), and at least the second voltage (VDD1), the second control signal (SLPB) or the third control signal (SDB) having a second voltage swing (VDD) different from the first voltage swing.

In operation 1306 of method 1300, at least a first supply voltage (VDDAI), a second supply voltage (VDDMH) or a third supply voltage (VDDH) is supplied by a header circuit in response to at least the first output control signal, the second output control signal or the third output control signal.

In operation 1308 of method 1300, the power control circuit is caused to enter a power management mode in response to a first value (1) of the first control signal (PISO). In some embodiments, the power management mode has a first reduced power state and a second reduced power state. In some embodiments, causing the power control circuit to enter the power management mode of operation 1308 comprises turning off the second voltage supply (VDD) and causing a memory circuit to be in the first reduced power state or the second reduced power state in response to at least the first supply voltage (VDDAI) or the first control signal (PISO). In some embodiments, the memory circuit is coupled to the power control circuit and the first header circuit.

In some embodiments, causing the memory circuit to be in the first reduced power state or the second reduced power state in response to at least the first supply voltage (VDDAI) or the first control signal (PISO), comprises causing the memory circuit to be in the second reduced power state in response to the first output control signal (SD_VDDM) having a first logical value (1), or causing the memory circuit to be in the first reduced power state in response to the first output control signal (SD_VDDM) having a second logical value (0). In some embodiments, the second reduced power state corresponding to a shut-down mode of the memory circuit, the first reduced power state corresponding to a sleep mode of the memory circuit, and the first logical value being different from the second logical value.

In operation 1310 of method 1300, the power control circuit is caused to leave the power management mode thereby entering a normal mode in response to a second value (0) of the first control signal (PISO), the power management mode having a normal power state, the first reduced power state and the second reduced power state, the second value being opposite from the first value. In some embodiments, causing the power control circuit to leave the power management mode of operation 1310 comprises turning on the second voltage supply (VDD).

In some embodiments, causing the power control circuit to leave the power management mode of operation 1310 further comprises causing the memory circuit to be in the first reduced power state in response to the third output control signal (SLP_VDD) and the second output control signal (SLP_VDDM) having a first logical value (1), and the first control signal (PISO) and the first output control signal (SD_VDDM) having a second logical value (0), causing the memory circuit to be in the second reduced power state in response to the first control signal (PISO) having a second logical value (0), and the first output control signal (SD_VDDM), the second output control signal (SLP_VDDM) and the third output control signal (SLP_VDD) having the first logical value (1), or causing the memory circuit to be in the normal power state in response to the first control signal (PISO), the first output control signal (SD_VDDM), the second output control signal (SLP_VDDM) and the third output control signal (SLP_VDD) having the second logical value (0).

In some embodiments, the normal power state corresponding to a normal power mode of the memory circuit. In some embodiments, the first reduced power state corresponding to a sleep mode of the memory circuit, and the first logical value being different from the second logical value. In some embodiments, the second reduced power state corresponding to a shut-down mode of the memory circuit.

In some embodiments, the first logical value is a logical high. In some embodiments the first logical value is a logical low.

In some embodiments, one or more of the operations of method 1300 is not performed. While method 1300 was described above with reference to FIGS. 1-2, it is understood that method 1300 utilizes the features of one or more of FIGS. 3-12. In some these embodiments, other operations of method 1300 would be performed consistent with the description and operation of circuits 300-1200 of FIGS. 3-12.

Furthermore, various PMOS or NMOS transistors shown in FIGS. 1-13 are of a particular dopant type (e.g., N-type or P-type) are for illustration purposes. Embodiments of the disclosure are not limited to a particular transistor type, and one or more of the PMOS or NMOS transistors shown in FIGS. 1-13 can be substituted with a corresponding transistor of a different transistor/dopant type. Similarly, the low or high logical value of various signals used in the above description is also for illustration. Embodiments of the disclosure are not limited to a particular logical value when a signal is activated and/or deactivated. Selecting different logical values is within the scope of various embodiments.

Selecting different numbers of inverters in circuits 100-200, 500-600, 800, 1100 are within the scope of various embodiments. Selecting different numbers of circuit elements in circuits 100-200, 500-600, 800, 1100 are within the scope of various embodiments.

One aspect of this description relates to a circuit. The circuit includes a power management circuit and a memory circuit. The power management circuit configured to receive a first control signal and a second control signal, and to supply a first supply voltage, a second supply voltage and a third supply voltage, the first control signal having a first voltage swing, and the second control signal having a second voltage swing different from the first voltage swing, the first control signal causing the power management circuit to enter a power management mode having a first state and a second state. The memory circuit coupled to the power management circuit, and being in the first state or the second state in response to at least the first supply voltage supplied by the power management circuit.

Another aspect of this description relates to a circuit. The circuit includes a power control circuit and a first header circuit. The power control circuit coupled to a first voltage supply having a first voltage and a second voltage supply having a second voltage, the power control circuit configured to generate a first output control signal, a second output control signal and a third output control signal in response to at least a first control signal, a second control signal or a third control signal, at least the first voltage or the first control signal having a first voltage swing, and at least the second voltage, the second control signal or the third control signal having a second voltage swing different from the first voltage swing, the first control signal causing the power control circuit to enter a power management mode having a first reduced power state and a second reduced power state. The first header circuit coupled to the power control circuit, and configured to supply at least a first supply voltage, a second supply voltage or a third supply voltage in response to at least the first output control signal, the second output control signal or the third output control signal. In some embodiments, the power management mode includes the second voltage supply being turned off.

Yet another aspect of this description relates to a method of operating a circuit. The method includes receiving, by a power control circuit, at least a first control signal, a second control signal or a third control signal, the power control circuit being coupled to a first voltage supply having a first voltage and a second voltage supply having a second voltage. The method further includes generating, by the power control circuit, a first output control signal, a second output control signal and a third output control signal in response to at least a first control signal, a second control signal or a third control signal, at least the first voltage or the first control signal having a first voltage swing, and at least the second voltage, the second control signal or the third control signal having a second voltage swing different from the first voltage swing. The method further includes supplying, by a header circuit, at least a first supply voltage, a second supply voltage or a third supply voltage in response to at least the first output control signal, the second output control signal or the third output control signal. The method further includes causing the power control circuit to enter a power management mode in response to a first value of the first control signal, the power management mode having a first reduced power state and a second reduced power state. In some embodiments, causing the power control circuit to enter the power management mode comprises turning off the second voltage supply; and causing a memory circuit to be in the first reduced power state or the second reduced power state in response to at least the first supply voltage or the first control signal, the memory circuit being coupled to the power control circuit and the first header circuit.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. As such, the term source and drain are used interchangeably. Various signals are generated by corresponding circuits, but, for simplicity, the circuits are not shown.

Various figures show capacitive circuits using discrete capacitors for illustration. Equivalent circuitry may be used. For example, a capacitive device, circuitry or network (e.g., a combination of capacitors, capacitive elements, devices, circuitry, or the like) can be used in place of the discrete capacitor. The above illustrations include exemplary steps, but the steps are not necessarily performed in the order shown. Steps may be added, replaced, changed order, and/or eliminated as appropriate, in accordance with the spirit and scope of disclosed embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
a power management circuit configured to receive a first control signal and a second control signal, and to supply a first supply voltage, a second supply voltage and a third supply voltage, the first control signal having a first voltage swing, and the second control signal having a second voltage swing different from the first voltage swing, the first control signal causing the power management circuit to enter a power management mode having a first state and a second state; and
a memory circuit coupled to the power management circuit, and being in the first state or the second state in response to at least the first supply voltage supplied by the power management circuit;
wherein the power management circuit comprises a control circuit configured to generate a first output control signal, a second output control signal and a third output control signal in response to the first control signal and the second control signal, wherein the control circuit comprises:
a first level shifter circuit; and
a first header circuit coupled to at least the first level shifter circuit, a first voltage supply and a second voltage supply, and configured to supply the first supply voltage of the first voltage supply to a first voltage supply node in response to the first control signal, and to supply the second supply voltage of the second voltage supply to a second voltage supply node in response to a first level shifted signal, the first level shifted signal is a level shifted version of the first control signal.

2. The circuit of claim 1, wherein the first output control signal and the second output control signal having the first voltage swing, and the third output control signal having the second voltage swing; and
the power management circuit further comprises:
a second header circuit coupled to the control circuit and the memory circuit, and configured to adjust at least the first supply voltage, the second supply voltage or the third supply voltage in response to at least the first output control signal, the second output control signal or the third output control signal.

3. The circuit of claim 2, wherein the
first level shifter circuit is coupled to the first voltage supply having the first supply voltage, and the second voltage supply having the second supply voltage, the second voltage supply being different from the first voltage supply, and configured to receive the first control signal, and to generate at least the first level shifted signal in response to at least the first control signal, the first level shifted signal having the second voltage swing;
wherein the first header circuit is coupled to at least the first level shifter circuit.

4. The circuit of claim 3, wherein the control circuit further comprises:

a NAND logic gate coupled to at least the first header circuit by the second voltage supply node, the NAND logic gate being configured to generate a NAND control signal in response to the second control signal and a third control signal, the NAND control signal and the third control signal having the second voltage swing, the NAND logic gate comprising:
a first NAND input terminal configured to receive the third control signal;
a second NAND input terminal configured to receive the second control signal; and
a NAND output terminal configured to output the NAND control signal.

5. The circuit of claim 4, wherein the control circuit further comprises:
a first OR logic gate configured to generate the third output control signal in response to the first level shifted signal and the NAND control signal, the first OR logic gate comprising:
a first OR input terminal coupled to an output of the first level shifter circuit and configured to receive the first level shifted signal;
a second OR input terminal coupled to the NAND output terminal and configured to receive the NAND control signal; and
a first OR output terminal configured to output the third output control signal.

6. The circuit of claim 5, wherein the control circuit further comprises:
a second level shifter circuit coupled to the first voltage supply by the first voltage supply node, and the second voltage supply by the second voltage supply node, the second level shifter circuit configured to receive the NAND control signal, and to generate at least a fourth control signal in response to at least the NAND control signal, the fourth control signal having the first voltage swing; and
a second OR logic gate configured to generate the second output control signal in response to the first control signal and the fourth control signal, the second OR logic gate comprising:
a third OR input terminal configured to receive the first control signal;
a fourth OR input terminal coupled to an output of the second level shifter circuit and configured to receive the fourth control signal; and
a second OR output terminal configured to output the second output control signal.

7. The circuit of claim 3, wherein the control circuit further comprises:
an inverter coupled to at least the first header circuit by the second voltage supply node, the inverter being configured to receive a third control signal and, to generate a fourth control signal in response to the third control signal, the fourth control signal and the third control signal having the second voltage swing, the inverter comprising:
an input terminal of the inverter is configured to receive the third control signal; and
an output terminal of the inverter is configured to output the fourth control signal.

8. The circuit of claim 7, wherein the control circuit further comprises:
a second level shifter circuit coupled to the first voltage supply by the first voltage supply node, and the second voltage supply by the second voltage supply node, the second level shifter circuit configured to receive the fourth control signal, and to generate at least a fifth control signal in response to at least the fourth control signal, the fifth control signal having the first voltage swing.

9. The circuit of claim 8, wherein the control circuit further comprises:
a latch circuit coupled to an output of the second level shifter circuit, and configured to generate the first output control signal in response to the first control signal and the fourth control signal,
the latch circuit comprising:
a first latch input terminal coupled to an output of the second level shifter circuit, and configured to receive the fourth control signal;
a second latch input terminal configured to receive the first control signal; and
a latch output terminal configured to output the first output control signal, the first output control signal corresponding to a previous state of the fourth control signal.

10. A circuit comprising:
a power control circuit coupled to a first voltage supply having a first voltage and a second voltage supply having a second voltage, the power control circuit configured to generate a first output control signal, a second output control signal and a third output control signal in response to at least a first control signal, a second control signal or a third control signal, at least the first voltage or the first control signal having a first voltage swing, and at least the second voltage, the second control signal or the third control signal having a second voltage swing different from the first voltage swing, the first control signal causing the power control circuit to enter a power management mode having a first reduced power state and a second reduced power state; and
a first header circuit coupled to the power control circuit, and configured to supply at least a first supply voltage, a second supply voltage or a third supply voltage in response to at least the first output control signal, the second output control signal or the third output control signal,
wherein the power management mode includes the second voltage supply being turned off; and
wherein the power control circuit comprises:
a first level shifter circuit; and
a second header circuit coupled to at least the first level shifter circuit, the first voltage supply and the second voltage supply, and configured to supply the first voltage of the first voltage supply to a first voltage supply node in response to the first control signal, and to supply the second voltage of the second voltage supply to a second voltage supply node in response to a first level shifted signal, the first level shifted signal is a level shifted version of the first control signal.

11. The circuit of claim 10, further comprising:
a memory circuit coupled to the power control circuit and the first header circuit, and being in the first reduced power state or the second reduced power state in response to at least the first supply voltage or the power control circuit entering the power management mode.

12. The circuit of claim 11, wherein the first header circuit comprises:
a first P-type transistor having a source coupled with the first voltage supply, a gate of the first P-type transistor is configured to receive the first output control signal, and a drain of the first P-type transistor is coupled with the memory circuit by a first node, the first P-type transistor being configured to supply the first supply voltage to the memory circuit;
a second P-type transistor having a source coupled with the first voltage supply, a gate of the second P-type transistor is configured to receive the second output control signal, and a drain of the second P-type transistor is coupled with the memory circuit by a second node, the second P-type transistor being configured to supply the second supply voltage to the memory circuit; and
a third P-type transistor having a source coupled with the second voltage supply, a gate of the third P-type transistor is configured to receive the third output control signal, and a drain of the third P-type transistor is coupled with the memory circuit by a third node, the third P-type transistor being configured to supply the third supply voltage to the memory circuit.

13. The circuit of claim 12, wherein the memory circuit comprises:
a memory cell array coupled to the first P-type transistor by the first node, being configured to store data, and being configured to receive the first supply voltage from the first node;
a first peripheral circuit coupled to the memory cell array and the second P-type transistor, and being configured to receive the second supply voltage from the second node; and
a second peripheral circuit coupled to the memory cell array and the third P-type transistor, and being configured to receive the third supply voltage from the third node.

14. The circuit of claim 13, further comprising:
an output circuit coupled to the memory cell array and the power control circuit, and configured to clamp a first data signal on a fourth node, the first data signal having the second voltage swing in response to the first output control signal, the first output control signal having the first voltage swing.

15. The circuit of claim 14, wherein the output circuit comprises:
a buffer circuit coupled to the memory cell array, configured to receive a second data signal, and to output a third data signal; and
a NOR logic gate comprising:
a first NOR input terminal coupled to an output of the buffer circuit and configured to receive the third data signal;
a second NOR input terminal coupled to the power control circuit and configured to receive the second output control signal; and
a first NOR output terminal configured to output a fourth data signal (preQ).

16. The circuit of claim 15, wherein the output circuit further comprises:
a second level shifter circuit coupled to the first voltage supply and the second voltage supply, and configured to receive the fourth data signal, and to generate at least an inverted first data signal in response to at least the fourth data signal, the inverted first data signal having the second voltage swing; and
an inverter comprising:
an input terminal of the inverter coupled to an output of the second level shifter circuit, and configured to receive the inverted first data signal; and an output terminal of the inverter is configured to generate the first data signal.

17. The circuit of claim 16, wherein the output circuit further comprises:
an N-type transistor having a source coupled with a reference voltage supply, a gate of the N-type transistor is coupled to the power control circuit and configured to receive the second output control signal, and a drain of the N-type transistor is coupled with the output terminal of the inverter by the fourth node.

18. A method of operating a circuit, the method comprising:
receiving, by a power control circuit, at least a first control signal, a second control signal or a third control signal, the power control circuit being coupled to a first voltage supply having a first voltage and a second voltage supply having a second voltage;
generating, by the power control circuit, a first output control signal, a second output control signal and a third output control signal in response to at least the first control signal, the second control signal or the third control signal, at least the first voltage or the first control signal having a first voltage swing, and at least the second voltage, the second control signal or the third control signal having a second voltage swing different from the first voltage swing;
supplying, by a first header circuit, at least a first supply voltage, a second supply voltage or a third supply voltage in response to at least the first output control signal, the second output control signal or the third output control signal;
supplying, by a second header circuit, the first voltage of the first voltage supply to a first voltage supply node in response to the first control signal, and to supply the second voltage of the second voltage supply to a second voltage supply node in response to a first level shifted signal, the first level shifted signal is a level shifted version of the first control signal, wherein the second header circuit is coupled to at least a first level shifter circuit;
causing the power control circuit to enter a power management mode in response to a first value of the first control signal, the power management mode having a first reduced power state and a second reduced power state, wherein causing the power control circuit to enter the power management mode comprises:
turning off the second voltage supply; and
causing a memory circuit to be in the first reduced power state or the second reduced power state in response to at least the first supply voltage or the first control signal, the memory circuit being coupled to the power control circuit and the first header circuit.

19. The method of claim 18, further comprising:
causing the power control circuit to leave the power management mode thereby entering a normal mode in response to a second value of the first control signal, the power management mode having a normal power state, the first reduced power state and the second reduced power state, the second value being opposite from the first value, wherein causing the power control circuit to leave the power management mode comprises:
turning on the second voltage supply;
causing the memory circuit to be in the first reduced power state in response to the third output control signal and the second output control signal having a first logical value, and the first control signal and the first output control signal having a second logical value, the first reduced power state corresponding to a sleep mode of the memory circuit, and the first logical value being different from the second logical value;
causing the memory circuit to be in the second reduced power state in response to the first control signal having a second logical value, and the first output control signal, the second output control signal and the third output control signal having the first logical value, the second reduced power state corresponding to a shut-down mode of the memory circuit; or
causing the memory circuit to be in the normal power state in response to the first control signal, the first output control signal, the second output control signal and the third output control signal having the second logical value, the normal power state corresponding to a normal power mode of the memory circuit.

20. The method of claim 18, wherein causing the memory circuit to be in the first reduced power state or the second reduced power state in response to at least the first supply voltage or the first control signal, comprises:
causing the memory circuit to be in the second reduced power state in response to the first output control signal having a first logical value, the second reduced power state corresponding to a shut-down mode of the memory circuit; or
causing the memory circuit to be in the first reduced power state in response to the first output control signal having a second logical value, the first reduced power state corresponding to a sleep mode of the memory circuit, and the first logical value being different from the second logical value.

\* \* \* \* \*